United States Patent
Hsu et al.

(10) Patent No.: US 10,529,581 B2
(45) Date of Patent: Jan. 7, 2020

(54) SIN SELECTIVE ETCH TO SIO2 WITH NON-PLASMA DRY PROCESS FOR 3D NAND DEVICE APPLICATIONS

(71) Applicants: L'Air Liquide, Société Anonyme pour l'Etude et l'Exploitation des Procédés Georges Claude, Paris (FR); Air Liquide Electronics U.S. LP, Dallas, TX (US)

(72) Inventors: Chih-Yu Hsu, Tskukuba (JP); Peng Shen, Tsukuba (JP); Takashi Teramoto, Tsukuba (JP); Nathan Stafford, Damascus, OR (US); Jiro Yokota, Tsukuba (JP)

(73) Assignees: L'Air Liquide, Société Anonyme pour l'Etude et l'Exploitation des Procédés Georges Claude, Paris (FR); Air Liquide Electronics U.S. LP, Dallas, TX (US)

(*) Notice: Subject to any disclaimer, the term of this patent is extended or adjusted under 35 U.S.C. 154(b) by 0 days.

(21) Appl. No.: 15/858,342

(22) Filed: Dec. 29, 2017

(65) Prior Publication Data
US 2019/0206696 A1 Jul. 4, 2019

(51) Int. Cl.
*H01L 21/311* (2006.01)
*H01L 21/3213* (2006.01)
(Continued)

(52) U.S. Cl.
CPC .. *H01L 21/31116* (2013.01); *H01L 21/32135* (2013.01); *H01L 21/31138* (2013.01); *H01L 27/10844* (2013.01); *H01L 27/115* (2013.01)

(58) Field of Classification Search
CPC ......... H01L 21/31116; H01L 21/31138; H01L 21/32135; H01L 21/32136;
(Continued)

(56) References Cited

U.S. PATENT DOCUMENTS 3,882,040 A 5/1975 Auge et al.
4,536,252 A 8/1985 McDonald et al.
(Continued)

FOREIGN PATENT DOCUMENTS

JP 2005 101583 4/2005
WO WO 2015 115002 8/2015

OTHER PUBLICATIONS

Bassett, D.W. et al., "Etching of Silicon Nitride in 3D NAND Structures," ECS Transactions, 69 (8), 2015, 159-167.
(Continued)

*Primary Examiner* — Lan Vinh
(74) *Attorney, Agent, or Firm* — Yan Jiang

(57) ABSTRACT

Methods for isotropic etching at least a portion of a silicon-containing layer on a sidewall of high-aspect-ratio (HAR) apertures formed on a substrate in a reaction chamber are disclosed. The HAR aperture formed by plasma etching a stack of alternating layers of a first silicon-containing layer and a second silicon-containing layer, the second silicon-containing layer is different from the first silicon-containing layer. The method comprising the steps of: a) introducing a fluorine containing etching gas selected from the group consisting of nitrosyl fluoride (FNO), trifluoroamine oxide ($F_3NO$), nitryl fluoride ($FNO_2$) and combinations thereof into the reaction chamber; and b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture. Alternatively, the disclosed etching processes are cyclic etching processes.

20 Claims, 20 Drawing Sheets

(51) Int. Cl.
*H01L 27/108* (2006.01)
*H01L 27/115* (2017.01)

(58) Field of Classification Search
CPC ......... H01L 21/32137; H01L 21/32138; H01L 27/10844; H01L 27/115
USPC ....... 438/706, 710, 712, 714, 719, 720, 723, 438/736, 758, 738; 216/58, 67, 72, 74
See application file for complete search history.

(56) References Cited

U.S. PATENT DOCUMENTS

| | | | |
|---|---|---|---|
| 5,376,234 | A | 12/1994 | Yanagida |
| 5,445,712 | A * | 8/1995 | Yanagida .......... H01L 21/31116 216/67 |
| 5,505,816 | A | 4/1996 | Barnes et al. |
| 6,380,095 | B1 | 4/2002 | Liu et al. |
| 8,679,259 | B2 | 3/2014 | Kameda et al. |
| 9,683,288 | B2 | 6/2017 | Kameda et al. |
| 2001/0020516 | A1 | 9/2001 | Khan et al. |
| 2003/0143846 | A1 | 7/2003 | Sekiya et al. |
| 2006/0183055 | A1* | 8/2006 | O'Neill ............. H01L 21/02126 430/316 |
| 2006/0201533 | A1 | 9/2006 | Wani et al. |
| 2008/0236482 | A1 | 10/2008 | Sonobe et al. |
| 2008/0236483 | A1 | 10/2008 | Sonobe et al. |
| 2010/0132744 | A1 | 6/2010 | Tadaki |
| 2014/0357085 | A1* | 12/2014 | Moriya ............. H01L 21/67069 438/706 |
| 2015/0132968 | A1* | 5/2015 | Ren .................... H01J 37/32357 438/714 |
| 2015/0167163 | A1* | 6/2015 | Kubota ............. H01L 21/02211 216/39 |
| 2017/0178923 | A1 | 6/2017 | Surla et al. |

OTHER PUBLICATIONS

Kastenmeier, B.E.E. et al., "Surface etching mechanism of silicon nitride in fluorine and nitric oxide containing plasmas," J. Vac. Sci. Technol. A, 19 (2001), 25-30.

Kigoshi, A. et al., "The behavior of silicon and aluminum in the nitrofluor process," Journal of the Mining and Metallurgical Institute of Japan, 89 (1973), 799-804.

Tajima, S. et al., "Formation of nanoporous features, flat surfaces, or crystallographically oriented etched profiels by the Si chemical dry etching using the reaction of $F_2 + NO \rightarrow FNO$ at an elevated temperature," J. Phys. Chem. C, 117 (2013), 20810, A-H.

Yonemura, T. et al., "Evaluation of FNO and $F_3NO$ as substitute gases for semiconductor CVD chamber cleaning," J. Electrochem. Soc., 150 (2003), G707-G610.

International Search Report and Written Opinion for corresponding PCT/US2018/065655, dated Apr. 16, 2019.

* cited by examiner

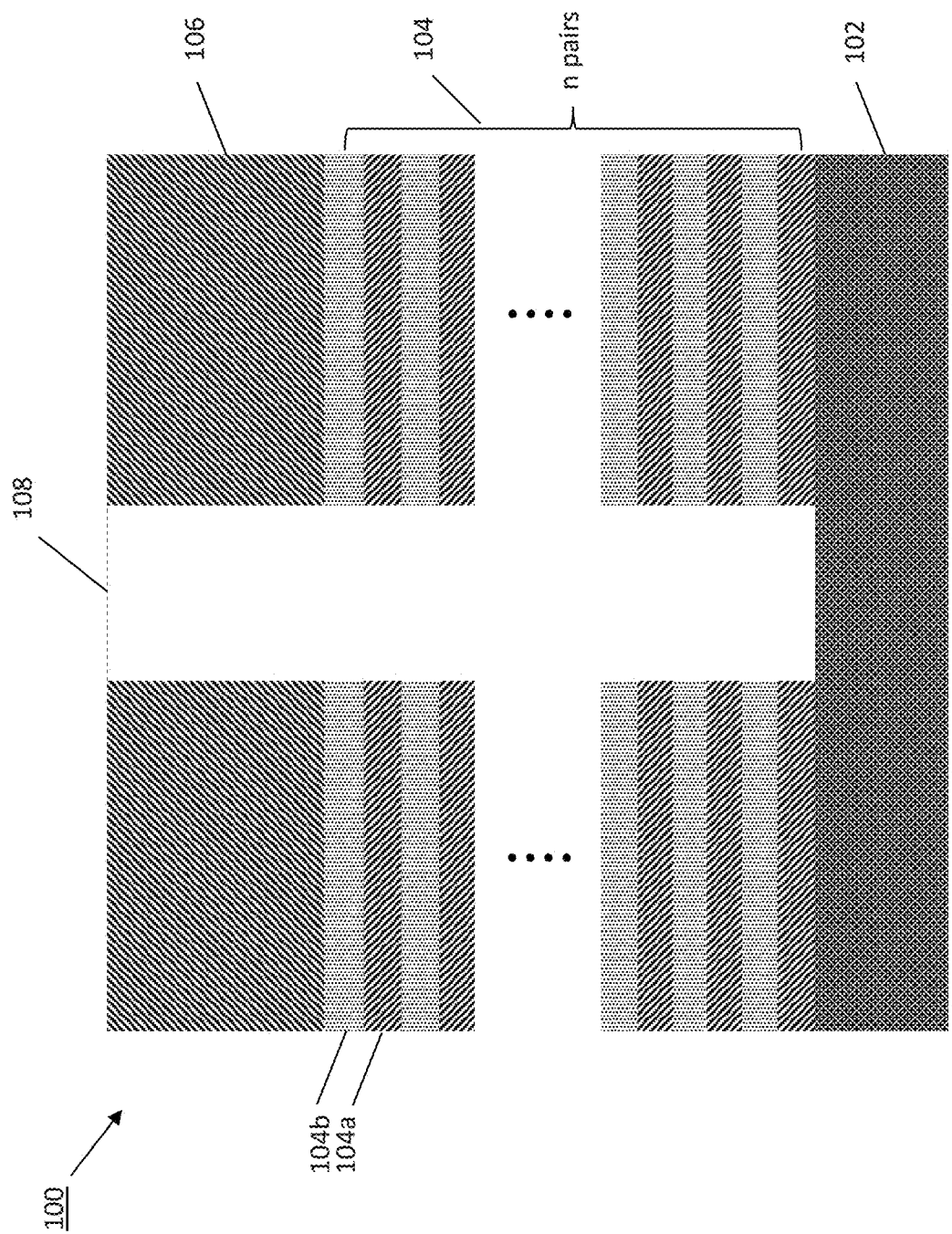

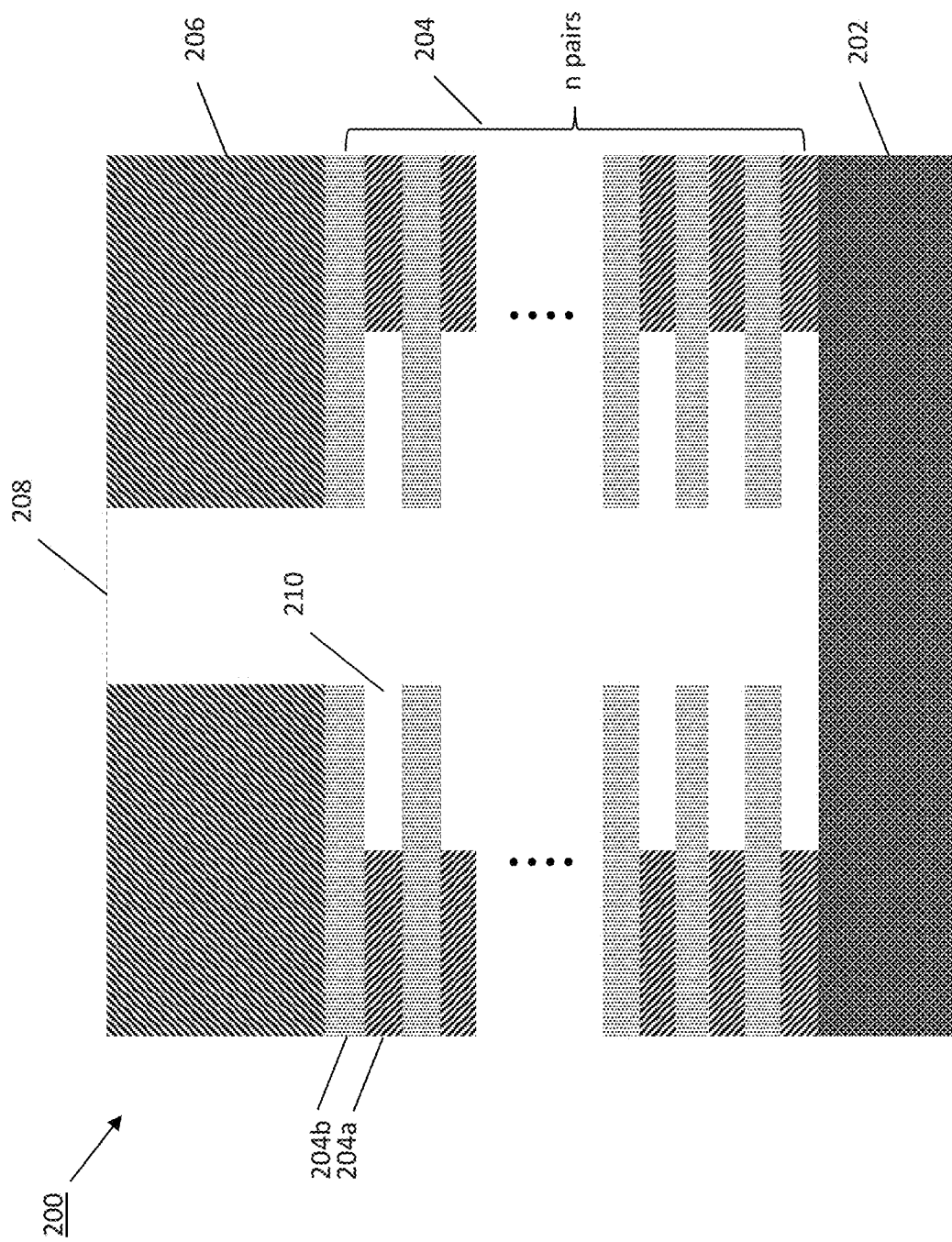

FNO passivation Line

1. Vacuum line (< $10^{-1}$ mbar);
2. 5% FNO in $N_2$, 0.01MPa, 1 hr; Gas removal;
3. 5% FNO in $N_2$, 0.15MPa, 1 hr; Gas removal;
4. 5% FNO in $N_2$, 0.40MPa, 8 hr; Gas removal;
5. 5% FNO in $N_2$, 1.00MPa, 8 hr; Gas removal;
6. 5% FNO in $N_2$, 2.00MPa, 8 hr; Gas removal;
7. 5% FNO in $N_2$, 3.16MPa, 8 hr;
8. Vacuum and purge the line.

FIG. 10

SIN SELECTIVE ETCH TO SIO2 WITH NON-PLASMA DRY PROCESS FOR 3D NAND DEVICE APPLICATIONS

TECHNICAL FIELD

Disclosed are methods for selectively etching SiN versus $SiO_2$ with non-plasma dry etching process for 3D NAND device applications. The disclosed methods provide processes for selective isotropic etching of SiN or Poly-Si (p-Si) materials versus $SiO_2$ using a fluorine containing etching gas selected from the group consisting of nitrosyl fluoride (FNO), trifluoroamine oxide ($F_3NO$), nitryl fluoride ($FNO_2$) and combinations thereof by non-plasma dry thermal etching process, with or without plasma activation of the fluorine containing etching gases.

BACKGROUND

SiN is a common material used in semiconductor processes and devices, such as in patterning technology and flash memory. The challenge of using SiN is etching selectivity and etch rate. In the semiconductor processes, SiN usually needs to be etched from other silicon materials surrounding the SiN, for instance, $SiO_2$. In 3D NAND device applications, after creating a high-aspect-ratio (HAR) aperture in a stacked structure of alternating SiN and $SiO_2$ layers (ONON), SiN layers need to be removed inside the HAR aperture. Thus, horizontal isotropic etching of SiN with high selectivity to $SiO_2$ and same etching rate of SiN at both top and bottom in the HAR aperture are required in 3D NAND device applications.

Wet etching process with $H_3PO_4$ may currently have been used to remove SiN in industry. However, when the HAR trench becomes deeper, there may be issues for liquid chemicals reaching to the bottom of the HAR trench due to surface tension effect. Dry etching therefore becomes a solution to develop. Dry etching may reduce process time and has less impurity introduction.

Typical dry etching process utilizes a plasma that produces anisotropic etch. Since horizontal etching of SiN requires isotropic etching, there is a need for isotropic etch process for which plasma may not be suited.

Various dry etching methods have been developed to perform isotropic etching SiN from $SiO_2$. In addition, nitrosyl fluoride (FNO) has been used for etching SiN or silicon containing materials. For example, JP 4739709 to Tamaoki et al. discloses non-plasma cleaning or etching capability to SiN, SiC, and quartz with $F_2$+NO chemistry and showed example that the selectivity of SiN/quartz to be 16. U.S. Pat. Nos. 5,376,234 and 5,445,712 to Yanagida discloses thermal etching of SiN and $SiO_2$ with FNO chemistry, but no selectivity measures for other materials. U.S. Pat. Nos. 9,683,288 and 8,679,259 to Kameda et al. disclose a dry cleaning process in which FNO is generated by using a gas containing fluorine atoms with NO gas and supplied into a processing vessel. Kastenmeier et al. (J. Vac. Sci. Technol. A, 19 (2001) 25) discloses SiN etching in $F_2$ and NO containing plasmas, but no selectivity measures for other materials. Yonemura et al. (J. Electrochem. Soc., 150 (2003) G707) reported the evaluation of $SiO_2$ etching in FNO and $F_3NO$ containing gases, but no selectivity measures for other materials. Kigoshi et al. (Journal of the Mining and Metallurgical Institute of Japan, 89 (1973) p. 799) and Tajima et al. (J. Phys. Chem. C, 117 (2013) p. 20810) reported non-plasma etching to Si material using $F_2$, NO, and FNO gases.

Other exemplary examples of etching Si, SiN or other silicon containing films include U.S. Pat. Nos. 3,882,040, 4,536,252, 6,380,095, US20010020516, US20080236482, US20080236483, US20100132744 and US20030143846.

As such, there is a need for developing isotropic etching methods to prove differentiation for specific etching gases that are suitable for use in specific etching processes with good selectivity properties.

SUMMARY

Disclosed are methods for isotropic etching at least a portion of a silicon-containing layer on a sidewall of a high-aspect-ratio (HAR) aperture formed on a substrate in a reaction chamber, the HAR aperture formed by plasma etching a stack of alternating layers of a first silicon-containing layer and a second silicon-containing layer, the second silicon-containing layer is different from the first silicon-containing layer, the method comprising the steps of: a) introducing a fluorine containing etching gas selected from the group consisting of nitrosyl fluoride (FNO), trifluoroamine oxide ($F_3NO$), nitryl fluoride ($FNO_2$) and combinations thereof into the reaction chamber; and b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture.

Also, disclosed are methods for isotropic etching at least a portion of a silicon-containing layer on a sidewall of a high-aspect-ratio (HAR) aperture formed on a substrate in a reaction chamber, the HAR aperture formed by plasma etching a stack of alternating layers of a first silicon-containing layer and a second silicon-containing layer, the second silicon-containing layer is different from the first silicon-containing layer, the method comprising the steps of: a) introducing FNO gas into the reaction chamber; and b) removing at least a portion of the second silicon-containing layers by selectively etching the second silicon-containing layers versus the first silicon-containing layers with FNO gas to produce recesses between the first silicon-containing layers on the sidewall of the HAR aperture.

Either of the disclosed methods may include one or more of the following aspects:
- the fluorine containing etching gas being nitrosyl fluoride (FNO);
- the fluorine containing etching gas being trifluoroamine oxide ($F_3NO$);
- the fluorine containing etching gas being nitryl fluoride ($FNO_2$);
- the fluorine containing etching gas containing one nitrogen;
- the fluorine containing etching gas containing oxygen;
- introducing an additional gas into the reaction chamber;
- the additional gas being selected from the group consisting of $F_2$, NO, $O_2$, COS, $CO_2$, CO, $NO_2$, $N_2O$, $SO_2$, $O_3$, $Cl_2$, HF, $H_2$ and HBr;
- the additional gas being NO;
- the additional gas being $F_2$;
- the additional gas being excess $F_2$;
- the additional gas comprising approximately 0.01% by volume to approximately 99.9% by volume of a total volume of the fluorine containing etching gas and the additional gas introduced into the reaction chamber;

mixing the fluorine containing etching gas and the additional gas prior to introduction to the reaction chamber to produce a mixture;
mixing FNO gas and the additional gas prior to introduction to the reaction chamber to produce a mixture;
mixing FNO gas and NO gas prior to introduction to the reaction chamber to produce a mixture;
mixing $F_2$ gas and NO gas prior to introduction to the reaction chamber to produce a mixture;
introducing the fluorine containing etching gas into the reaction chamber separately from the additional gas;
introducing NO and an inert gas into the reaction chamber;
introducing an inert gas and excess $F_2$ into the reaction chamber;
introducing an inert gas with the fluorine containing etching gas;
mixing the fluorine containing etching gas and the inert gas prior to introduction to the reaction chamber;
introducing the fluorine containing etching gas into the reaction chamber separately from the inert gas;
introducing an inert gas with FNO gas;
the inert gas being $N_2$;
the inert gas being Ar;
a concentration of the fluorine containing etching gas ranging from 0.1% to 20% by volume;
a concentration of FNO gas ranging from 0.1% to 20% by volume;
the HAR aperture being plasma etched by the plasma etching gas selected from the group consisting of 1,1,1,3,3,3-hexafluoropropane ($C_3H_2F_6$), 1,1,2,2,3,3-hexafluoropropane (iso-$C_3H_2F_6$), 1,1,1,2,3,3,3-heptafluoropropane ($C_3HF_7$), and 1,1,1,2,2,3,3-heptafluoropropane (iso-$C_3HF_7$);
the HAR aperture being plasma etched by the plasma etching gas selected from the group consisting of c$C_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$ and combination thereof;
c) purging the reaction chamber with an inert gas, and d) repeating a) to c);
c) purging the reaction chamber with an inert gas; d) introducing an activation gas into the reaction chamber; e) purging the reaction chamber with the inert gas; and f) repeating a) to e);
the activation gas being selected from the group consisting of Ar, Kr, Xe, Ne, He and $H_2$;
c) purging the reaction chamber with an inert gas; d) introducing a mixture of etching gases into the reaction chamber; e) preserving the surface of the first silicon-containing layer from etching; f) purging the reaction chamber with the inert gas; and g) repeating a) to f);
the mixture of etching gases being FNO, a mixture of FNO and NO, or a mixture of $F_2$ and NO;
the mixture of etching gases being FNO;
the mixture of etching gases being a mixture of FNO and NO;
the mixture of etching gases being a mixture of $F_2$ and NO;
the second silicon-containing layer being SiN;
the second silicon-containing layer being p-silicon;
a ratio of etch rates for SiN versus $SiO_2$ ranging from 10 to 3000;
a ratio of etch rates for SiN versus $SiO_2$ ranging from 20 to 2000;
a ratio of etch rates for SiN versus $SiO_2$ ranging from 30-1000;
a selectivity reaching to 3000 for a thermal oxidation formed $SiO_2$ layer;
a selectivity of SiN versus plasma enhanced CVD $SiO_2$ ranging from 30 to 1000.
introducing the fluorine containing etching gas into the reaction chamber at a flow rate ranging from approximately 0.1 sccm to approximately 1 slm;
the reaction chamber having a pressure ranging from approximately 1 Torr to approximately 400 Torr;
the reaction chamber having a pressure ranging from approximately 1 Torr to approximately 250 Torr;
the reaction chamber having a pressure ranging from approximately 1 Torr to approximately 100 Torr;
the etching step being performed under a temperature ranging from approximately −196° C. to 1000° C.;
the etching step being performed under a temperature ranging from approximately −196° C. to room temperature;
the etching step being performed under a temperature ranging from approximately room temperature to approximately 1000° C.;
the etching step being performed under a temperature ranging from approximately room temperature to approximately 400° C.;
the etching step being performed under a temperature ranging from approximately room temperature to approximately 250° C.; and
measuring the fluorine containing etching gas and the etching surface by Quadrupole mass spectrometer, optical emission spectrometer, FTIR, or other end point detection measurement tool.

Also disclosed are fluorine containing etching gases having nitrogen and oxygen. The disclosed fluorine containing etching gases include one or more of the following aspects:
the fluorine containing etching gas being FNO;
the fluorine containing etching gas being $F_3NO$;
the fluorine containing etching gas being $FNO_2$;
the fluorine containing etching gas containing one nitrogen;
the fluorine containing etching gas containing oxygen;
having a purity ranging from approximately 95% to approximately 99.999% by volume;
comprising between approximately 10 parts per trillion to approximately 5% by volume trace gas impurities;
the trace gas impurities comprising water;
the trace gas impurities comprising $CO_2$;
the trace gas impurities comprising $N_2$; and
the fluorine containing etching gas having a water content of less than 20 ppmw.

NOTATION AND NOMENCLATURE

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch.

The term "pattern etch" or "patterned etch" refers to etching a non-planar structure, such as a stack of silicon-containing films below a patterned hardmask layer.

As used herein, the term "etch" or "etching" refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical apertures, trenches, channel holes, gate trenches, staircase contacts, capacitor holes, contact holes, etc., in the substrate.

The term "mask" refers to a layer that resists etching. The hardmask layer may be located above the layer to be etched.

The term "aspect ratio" refers to a ratio of the height of a trench (or aperture) to the width of the trench (or the diameter of the aperture).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably when the etching compound is in a gaseous state under room temperature and ambient pressure. It is understood that an etching compound may correspond to, or related to an etching gas, and that the etching gas may refer to the etching compound.

The terms "via", "aperture" and "hole" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 1a is an exemplary cross-sectional side view of an exemplary HAR aperture in a 3D NAND stack;

FIG. 1b is an exemplary cross-sectional side view of exemplary isotropic etched recesses formed in the HAR aperture shown in FIG. 1a;

FIG. 8b is a magnified SEM image for the marked area shown in FIG. 8a;

FIG. 10 is an exemplary passivation process.

DESCRIPTION OF PREFERRED EMBODIMENTS

Figure 2A:
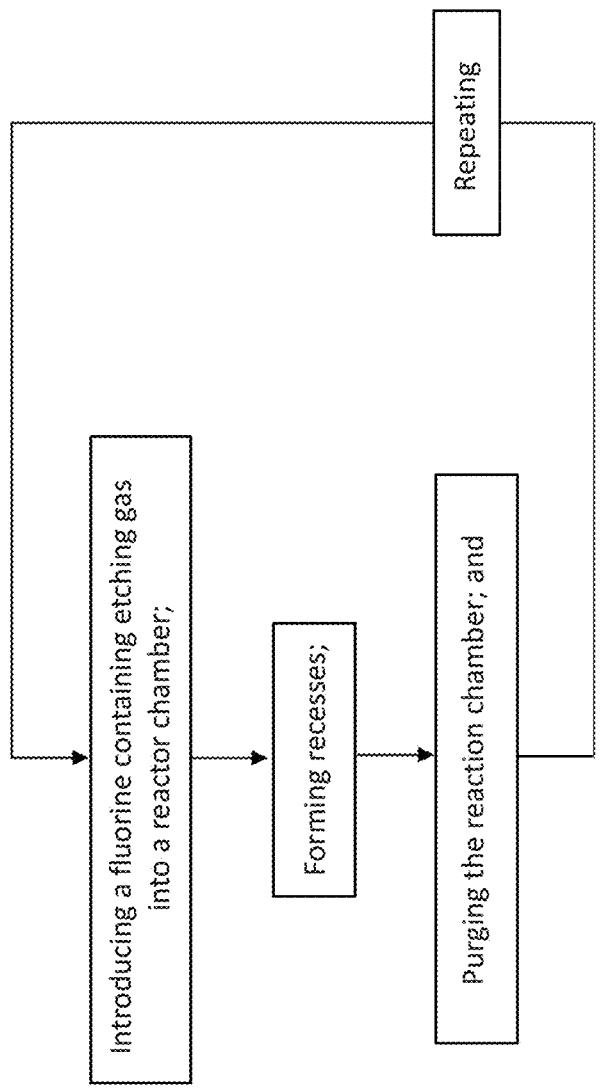
FIG. 2a is a schematic diagram of the cyclic etching process disclosed herein.

Disclosed are methods for non-plasma thermal dry etching silicon-containing films in 3D NAND device applications. The disclosed are methods for fabricating a semiconductor structure for forming gate trenches, memory bits, etc. Furthermore, the disclosed are methods for selectively isotropic etching one silicon-containing layer from the other silicon-containing layer, such as etching SiN from $SiO_2$ with a selectivity ranging from 10 to 3000 in 3D NAND device applications. The disclosed are also methods for selectively isotropic etching p-Si layer from $SiO_2$ layer.

More specifically, the disclosed are methods for etching an etched structure of silicon-containing layers deposited over a substrate. The etched structure includes high-aspect-ratio (HAR) apertures formed by plasma etching a stack of alternating layers of a first silicon-containing layer and a second silicon-containing layer on the substrate, in which the second silicon-containing layer is different from the first silicon-containing layer. The disclosed are methods for selectively isotropic etching at least a portion of a silicon-containing layer on a sidewall of a HAR aperture. The disclosed are methods for horizontally selectively isotropic etching at least a portion of a silicon-containing layer on a sidewall of a HAR aperture.

The disclosed methods provide the processes for selectively isotropic etching of SiN or p-Si materials with regards to $SiO_2$ with a fluorine containing etching gas selected from the group consisting of nitrosyl fluoride (FNO), trifluoroamine oxide ($F_3NO$), nitryl fluoride ($FNO_2$) and combinations thereof by thermal etching, without plasma activation of the fluorine containing etching gases. Here the fluorine containing etching gases may be plasma activated. One of ordinary skill in the art will recognize that the disclosed fluorine containing etching gas with plasma activation will selectively isotropic etch of SiN or p-Si materials with regards to $SiO_2$.

The disclosed fluorine containing etching gases may be fluorine, nitrogen and oxygen containing etching gases or compounds. The disclosed fluorine containing etching gases may be FNO. The disclosed fluorine containing etching gases may be $F_3NO$. The disclosed fluorine containing etching gases may be $FNO_2$.

The disclosed fluorine containing etching gases solely have F, N and O. The disclosed fluorine containing etching gases are a nitrogen-containing fluorine compound and contain one nitrogen.

The disclosed fluorine containing etching gases are commercially available and their structure formula, CAS numbers and boiling points are included in Table 1. One of ordinary skill in the art will recognize that the synthesis methods for these compounds may be obtained using the CAS numbers provided.

TABLE 1

Commercially available etching compounds

| Etching Compounds | Formula | Structure | CAS Number | Boiling Point (° C.) |
|---|---|---|---|---|
| Nitrosyl Fluoride | FNO | F–N=O | 7789-25-5 | −72.4 |
| Trifluoroamine oxide | $F_3NO$ | F₃N=O | 13847-65-9 | −87.6 |
| Nitryl Fluoride | $FNO_2$ | F–N(=O)O | 10022-50-1 | −72 |

Herein, the disclosed fluorine containing etching gases may etch the silicon-containing films including a SiN layer and poly-silicon layer.

The disclosed fluorine containing etching gases may provide high selectivity of etching SiN or p-Si layer versus $SiO_2$ layer, hardmask layers, etch stop layers and device channel materials. The selectivity of etching SiN or p-Si layer versus $SiO_2$ layer may range from 10 to 3000 in 3D NAND device applications, preferably, from 20 to 2000, more preferably, from 30 to 1000. The selectivity ranges depend on process parameters, such as, temperature, pressure, concentration of the etching gas, $SiO_2$ film formation process, etc.

The disclosed fluorine containing etching gases are provided at greater than 95% by volume purity, preferably at greater than 99.99% by volume purity, and more preferably at greater than 99.999% by volume purity. The disclosed fluorine containing etching gases contain less than 5% by volume trace gas impurities, with less than 150 ppm by volume of impurity gases, such as $N_2$ and/or $H_2O$ and/or $CO_2$, contained in said trace gaseous impurities. For example, FNO has less than 0.1% by volume trace gas impurities that include $F_2$, HF, and $H_2O$. Preferably, the water content in the disclosed fluorine containing etching gases is less than 20 ppmw by weight.

The disclosed fluorine containing etching gases are suitable for non-plasma thermal dry etching SiN and p-Si films.

Preferably, the disclosed fluorine containing etching gases are stable during the etching process for delivery into the reaction chamber.

The disclosed fluorine containing etching gases may provide high selectivity for etching SiN or p-Si versus $SiO_2$ in high aspect ratio structures, such as those having an aspect ratio ranging from 1:10 to 1000:1 in microelectromechanical systems (MEMS), DRAM and 3D NAND device applications.

Material compatibility tests are important to determine if any of the disclosed fluorine containing etching gases will react with chamber materials and degrade the performance of the chamber with short term or long term use. Key materials involved in parts of the chamber, valves, etc. include stainless steel, aluminum, nickel, nickel alloys, polychlorotrifluoroethene (PCTFE), polyvinylidene fluoride (PVDF), polytetrafluoroethylene (PTFE) and other metals and polymers or elastomers. At times these materials are exposed to high temperatures, for example, higher than room temperature, and high pressures, for example, higher than 1 atm, which may enhance their degradation. The metrology methods may include visual inspection, weight measurement, measuring nanometer scale changes in SEM, tensile strength, hardness, etc.

A passivation process may be carried out before performing a non-plasma thermal dry etching process in gas lines or a gas cabinet with the disclosed fluorine containing etching gases to exclude metal impurities. As shown in the example that follows, the passivation may be done using suggested recipes in the example, as shown in FIG. 10.

The disclosed fluorine containing etching gases may be used to non-plasma thermal dry etch SiN or p-Si films stacked in a 3D NAND etched structure having alternating layers of SiN/SiO (ONON) or p-Si/SiO (OPOP). The disclosed non-plasma thermal dry etching method may be used in etching of MEMS, such as a sacrificial layer. The disclosed non-plasma thermal dry etching method may be useful in the manufacture of semiconductor devices such as NAND or 3D NAND gates or Flash or DRAM memory or transistors such as fin-shaped field-effect transistor (FinFET), Bulk complementary metal-oxide-semiconductor (Bulk CMOS), fully depleted silicon-on-insulator (FD-SOI) structures. The disclosed fluorine containing etching gases may be used in other areas of applications, such as different front end of the line (FEOL) and back end of the line (BEOL) etch applications and low k applications as well. Additionally, the disclosed fluorine containing etching gases may also be used for etching Si in 3D through silicon aperture (TSV) plasma etch applications for interconnecting memory to logic on a substrate.

The disclosed non-plasma thermal dry etching method includes providing a reaction chamber having at least on substrate including at least one etched structure disposed therein. The reaction chamber may be a homemade or commercial reactor, depending on requirements for use. The substrate may be silicon-containing layer, titanium-containing layer, tantalum-containing layer, or the like. The reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), or microwave plasma reactors, or other types of etching systems capable of selectively removing a portion of the silicon-containing film or generating active species.

Also disclosed are methods of using the disclosed fluorine containing etching gases for fabricating a semiconductor structure under non-plasma thermal dry etching conditions. The disclosed methods provide for the use of the fluorine containing etching gases for thermal etching the Si-containing films. The disclosed methods also provide for inhibiting damage to a hardmask layer, protecting the hardmask layer or reinforcing the hardmask layer while forming recesses on a sidewall of apertures, holes or trenches. The disclosed methods are useful in the manufacture of semiconductor, such as in MEMS and 3D NAND device applications.

The disclosed fluorine containing etching gases are delivered in purity ranging from 95% to 99.999% by volume or could be purified with known standard purification techniques for removal of CO, $CO_2$, $N_2$, $H_2O$, HF, $H_2S$, $SO_2$, halides, and other hydrocarbons or hydrohalocarbons.

In one embodiment, the disclosed fluorine containing etching gas may be mixed with other gases either prior to introduction into the reaction chamber or inside the reaction chamber. Preferably, the other gases may be mixed prior to introduction to the chamber in order to provide a uniform concentration of the entering gas.

In another alternative, the disclosed fluorine containing etching gas may be introduced into the chamber independently of the other gases such as when two or more of the gases react.

The disclosed fluorine containing etching gas may be present in varying concentrations in a blend, for example, a concentration of FNO in the blend may range from 0.1% to 20% by volume.

Exemplary other gases may also include, without limitation, an inert gas, such as $N_2$, Ar, Kr, He, Xe, Ne, etc. The disclosed etching gases and the inert gas may be mixed together prior to introduction into the reaction chamber with the inert gas comprising between approximately 80% by volume and approximately 99.99999% (N7.0) by volume of the resulting mixture. Alternatively, the inert gas may be introduced to the chamber continuously while the etching gas is introduced to the chamber in pulses. Applicants discover the disclosed fluorine containing etching gases, for example, FNO, are effective for selective etching SiN versus $SiO_2$ by mixing the disclosed fluorine containing etching gas with inert gas (e.g. $N_2$).

Other exemplary gases with which the disclosed fluorine containing etching gas may be mixed include additional gases, such as $F_2$, NO, $O_2$, COS, $CO_2$, CO, $NO_2$, $N_2O$, $SO_2$, $O_3$, $Cl_2$, HF, $H_2$ and HBr.

The disclosed fluorine containing etching gas and the additional gas may be mixed prior to introduction to the reaction chamber. The additional gas may comprise between approximately 0.01% by volume to approximately 99.99% by volume of a total volume of the fluorine containing etching gas introduced into the chamber.

In another alternative, the disclosed fluorine containing etching gas, the additional gas and the inert gas are the only three gases that are used during the etching process.

The additional gas and the inert gas may be ionized through remote plasma reactor. Alternatively, the additional gas and the inert gas may not be ionized.

The disclosed methods horizontally isotropic etch at least a portion of a silicon-containing layer on a sidewall of a HAR aperture formed on a substrate with the disclosed fluorine containing etching gases under non-plasma thermal dry etching conditions. The HAR of the aperture ranges from 1:10 to 1000:1.

The disclosed non-plasma thermal dry etching method for etching a pre-formed aperture in a substrate containing alternating layers of a first silicon-containing layer and a second silicon-containing layer in which the pre-formed aperture is formed by plasma dry etching the alternating layers of the first silicon-containing layer and the second silicon-containing layer. The second silicon-containing layer is different from the first silicon-containing layer. The disclosed method comprises the steps of a) introducing a fluorine containing etching gas selected from the group consisting of FNO, $F_3NO$, $FNO_2$ and combinations thereof into the reaction chamber and b) removing at least a portion of the second silicon-containing layers by selectively etching the second silicon-containing layers versus the first silicon-containing layers with the fluorine containing etching gas to produce recesses between the first silicon-containing layers on a sidewall of the etched structure.

In one embodiment, the disclosed fluorine containing etching gas may be FNO introduced into the reaction chamber in a blend with an inert gas, such as $N_2$ or Ar. FNO may be present in varying concentrations in the blend. Preferably, a concentration of FNO in the blend may range from 0.1% to 20% by volume.

When FNO is used, FNO was filled in a nickel plated cylinder within a pressure range between 0.1 MPa to 10 MPa. Hastelloy material may be used for the cylinder valve. Metal impurities (such as Fe, Ni, Cr, Mn) are less than 1 ng/mL.

Alternatively, the disclosed fluorine containing etching gas may be FNO introduced into the reaction chamber in a blend with an inert gas, such as $N_2$ or Ar, and an addition of NO gas. FNO and NO may be present in varying concentrations in the blend. Preferably, a concentration of FNO in the blend may range from 0.1% to 20% by volume.

In another alternative, the disclosed fluorine containing etching gas may be a mixture of FNO, $F_2$ and $N_2$ introduced into the reaction chamber. Here excess $F_2$ may be applied.

In another alternative, a mixture of $F_2$ and NO gases may be introduced into the reaction chamber to produce FNO therein through the equation: $F_2+2NO \rightarrow 2FNO$. Subsequently, an inert gas, such as Ar or $N_2$, may be introduced into the reaction chamber. Then an additional $F_2$ and NO may be added to the mixture. Here excess $F_2$ may be applied.

In one embodiment, the disclosed fluorine containing etching gas is introduced into the reaction chamber containing a substrate and silicon-containing films. The disclosed fluorine containing etching gas may be introduced to the chamber at a flow rate ranging from approximately 0.1 sccm to approximately 1 slm. The additional gases and the inert gas, if any, may also be introduced to the chamber at a flow rate ranging from approximately 0.1 sccm to approximately 1 slm.

The silicon-containing films, such as SiN, or p-Si film, react with the disclosed fluorine containing etching gas to form volatile by-products that are removed from the reaction chamber. The $SiO_2$ layer and a-C mask are less reactive with the disclosed fluorine containing etching gas. Thus, the disclosed fluorine containing etching gas selectively reacts with the silicon-containing films to form volatile by-products.

The temperature and the pressure within the reaction chamber are held at conditions suitable for SiN or p-Si film to react with the disclosed fluorine containing etching gas. For instance, the substrate temperature in the reaction chamber may range between approximately from −196° C. to approximately 1000° C., preferably between approximately room temperature to approximately 1000° C.; more preferably between approximately room temperature to approximately 600° C.; even more preferably between approximately room temperature to approximately 400° C.; even more preferably between approximately room temperature to approximately 250° C. The preferable temperature ranges may also be preferred between −196° C. and room temperature; or between −196° C. and 0° C.; or between approximately 0° C. and room temperature. Reaction chamber wall temperature is the same as the reaction chamber temperature. Likewise, the pressure in the reaction chamber may be held between approximately 1 Torr and approximately 400 Torr, preferably, between approximately 1 Torr and approximately 250 Torr; more preferably, between approximately 1 Torr and approximately 100 Torr. During the etching process, the temperature may be controlled within 5° C. of temperature set points; the pressure may be controlled within 0.1 Torr of pressure set point of temperature set points.

The reactions between the silicon-containing film (e.g., SiN or p-Si) and the fluorine containing etching gas result in horizontally isotropic removal of the silicon-containing films from the sidewall of the apertures. Atoms of nitrogen, oxygen, and/or carbon may also be present in the silicon-containing film. The removal is due to a chemical reaction of the silicon-containing film and the fluorine containing etching gas.

The disclosed fluorine containing etching gas preferably exhibits high selectivity toward the mask layers and the $SiO_2$ layers and etches through the SiN or p-Si layers, resulting in recesses between the $SiO_2$ layers in a horizontal or lateral etch profile, which are important for MEMS, 3D NAND and DRAM device applications.

The disclosed etch processes or methods use the disclosed fluorine containing etching gases to etch the silicon-containing layers, such SiN and p-Si layers, and form recesses between the $SiO_2$ layers in MEMS, 3D NAND or DRAM structure for producing gate trenches, bit memory, etc., in pre-formed apertures. Typical materials that need to be etched by the disclosed fluorine containing etching gases may be silicon-containing compositions, such as, SiN or p-Si layers of ONON or OPOP in 3D NAND stacks. An etching selectivity of SiN versus $SiO_2$ using the disclosed fluorine containing etching gas may range from 10 to 3000; preferably, 20 to 2000; more preferably, 30-1000, depending on the ranges of process parameters, such as, temperature, pressure, concentration of the etching gas, etc. The etching selectivity of SiN versus $SiO_2$ using the disclosed fluorine containing etching gas also depends on formation processes of $SiO_2$ film, such as, thermal oxidation and plasma enhanced CVD process. For example, the selectivity may reach to 3000 for a $SiO_2$ layer formed by thermal oxidation. If thermal oxidation is not used to form the $SiO_2$ layer, the selectivity may not be as high. For example, the selectivity of SiN versus plasma enhanced CVD $SiO_2$ may range from 30 to 1000.

The disclosed etch processes or methods may be stopped by purging the etching gas with an inert gas, such as, Ar or $N_2$. The disclosed etch processes or methods may also be stopped by using a quenching gas, such as, $N_2$, NO or $O_2$. Stopping the etching process with a purging etch gas and/or using a quenching gas helps preserve the selectivity and/or slow the reaction. An end point detection system, such as, quadropole mass spectrometer (QMS), optical emission spectrometer (OES), FTIR, etc., may be applied to detect when the etching process should be stopped in order to avoid over etching.

The disclosed etching method may be a cyclic etching process with advantages of etch rate control, smooth surface, and throughput. The etching target may be pre-formed apertures on a substrate formed by plasma dry etching alternating layers of a first silicon-containing layer and a second silicon-containing layer. The second silicon-containing layer is different from the first silicon-containing layer. For example, the first silicon-containing layer may be a $SiO_2$ layer; the second silicon-containing layer may be a SiN or p-Si layer.

As shown in FIG. 2a, in one embodiment, the cyclic etching process include a) introducing a fluorine containing etching gas into the reaction chamber; b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture; c) purging the reaction chamber with an inert gas; and repeating a) to c). The fluorine containing etching gas is selected from the group consisting of FNO, $F_3NO$, $FNO_2$ and combinations thereof. Preferably, the fluorine containing etching gas is FNO. The inert gas may be $N_2$ or Ar. If the first silicon-containing layer is a $SiO_2$ layer and the second silicon-containing layer is a SiN or p-Si layer, the fluorine containing etching gas etches the SiN layers versus $SiO_2$ layers forming the recesses between the $SiO_2$ layers.

Figure 2B:
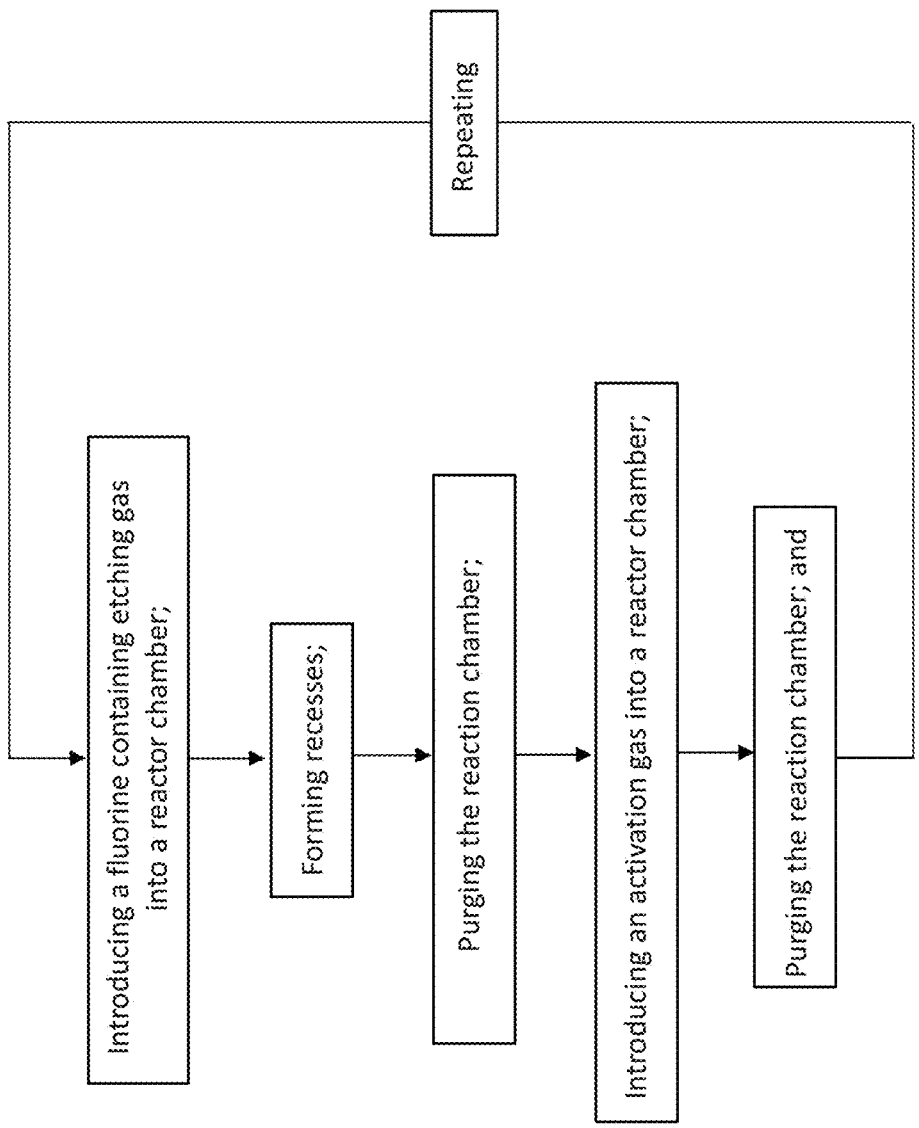
FIG. 2b is a schematic diagram of an alternative cyclic etching process disclosed herein.

Alternatively, as shown in FIG. 2b, the cyclic etching process may include the steps of a) introducing a fluorine containing etching gas into the reaction chamber; b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture; c) purging the reaction chamber with an inert gas; d) introducing an activation gas into the reaction chamber; e) purging the reaction chamber with the inert gas; and f) repeating a) to e). Here, the fluorine containing etching gas is selected from the group consisting of FNO, $F_3NO$, $FNO_2$ and combinations thereof. Preferably, the fluorine containing etching gas is FNO. The activation gas is an ionized gas selected from the group consisting of Ar, Kr, Xe, Ne, He and $H_2$. The ionized gas may be generated from a remote plasma chamber. Alternatively, the reaction chamber may be a plasma chamber. At the step of introducing the activation gas into the reaction chamber, plasma is turned ON in the plasma chamber to generate the activation gas. The inert gas may be $N_2$ or Ar. If the first silicon-containing layer is a $SiO_2$ layer and the second silicon-containing layer is a SiN or p-Si layer, the fluorine containing etching gas etches the SiN layers versus $SiO_2$ layers forming the recesses between the $SiO_2$ layers.

Figure 2C:
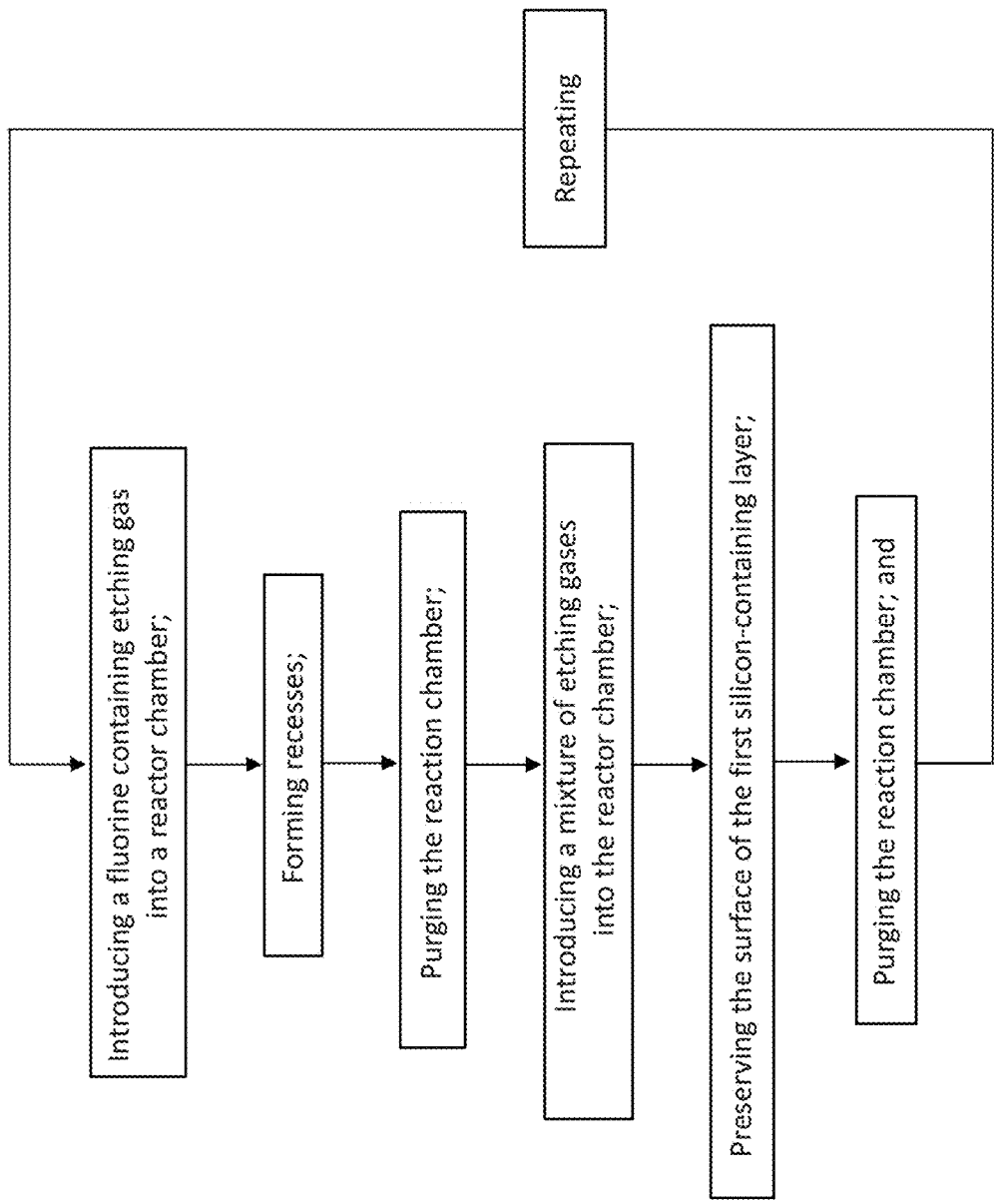
FIG. 2c is a schematic diagram of another alternative cyclic etching process disclosed herein.

The cyclic etching process may include the step of preserving the surface of the first silicon-containing layers from etching. For example, the first silicon-containing layers are $SiO_2$ layers. A fluorine containing gas may react with the surface of the substrate resulting in preserving the surface of the substrate from not reacting with other reactive gases, that is, preserving the surface of the substrate from etching. In one embodiment, as shown in FIG. 2c, the cyclic etching process may include a) introducing a fluorine containing etching gas into the reaction chamber; b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture; c) purging the reaction chamber with an inert gas; d) introducing a mixture of etching gases into the reaction chamber; e) preserving the surface of the first silicon-containing layers from etching; f) purging the reaction chamber with the inert gas; and g) repeating a) to f). If the first silicon-containing layer is a $SiO_2$ layer and the second silicon-containing layer is a SiN or p-Si layer, the fluorine containing etching gas etches the SiN layers versus $SiO_2$ layers forming the recesses between the $SiO_2$ layers. Herein, the mixture of etching gases may be FNO, a mixture of FNO and NO or a mixture of $F_2$ and NO. Excess $F_2$ may be applied. The mixture of the etching gases includes a fluorine containing gas, such as, FNO, that reacts with the surface of the substrate resulting in preserving the surface of the first silicon-containing layer (i.e., $SiO_2$ layer) from not reacting with other reactive gases, that is, preserving the surface of the first silicon-containing layer (i.e., $SiO_2$ layer) from etching. A concentration of FNO in the mixtures may be between 0.1% and 20% by volume. The inert gas may be $N_2$ or Ar.

The following are exemplary embodiments of semiconductor structures in a substrate on which the disclosed fluorine containing etching gases may be applied to etch. The semiconductor structures include, but are not limited to, contact holes and trenches.

In one embodiment, a substrate 100 may include a high aspect ratio aperture formed therein as shown in FIG. 1a. The aperture 108 is formed in a stack of n pairs of alternating layers of SiO 104a and SiN 104b (ONON) deposited on top of a silicon wafer 102 (i.e., ONON such as terabit cell array transistor (TCAT) technology or pipe-shaped bit cost scalable (P-BiCS) technology). Here n is integer. Preferably, n=96. More preferably, n=128, or even more. One of ordinary skill in the art will recognize that the number of the alternating layers of SiO/SiN 104 in the stack of the substrate 100 may vary. A hardmask layer 106 is deposited on top of the stack of n pairs of the alternating layers of SiO/SiN 104. The aperture 108 may be formed by plasma etching the stack of alternating layers of SiO 104a and SiN 104b. Here, one of ordinary skill in the art will recognize the silicon wafer 102 may be replaced with tungsten (W) wafer, and in some applications the SiN layers 104b may be replaced with p-Si layers (e.g., SiO/p-Si or OPOP), thereby a stack of n pairs of alternating layers of SiO/p-Si or OPOP will be formed on top of silicon wafer 102, where n is integer. one of ordinary skill in the art will recognize that the number of layers in the stack may vary (i.e., the integer n varies).

The hardmask layer 106 may contain C and H, as well as other elements, such as boron, nitrogen, oxygen, sulfur, chlorine, fluorine, aluminum, tungsten, titanium, zirconium etc., to improve etch resistance during SiO/SiN layer etch. One example of a boron-doped carbonaceous material is available from Applied Materials, Inc. of Santa Clara, Calif. under the trade name of advanced patterning film (APF), more particularly a species of the APF genus of materials known as APFc, which is boron doped. The hardmask layer 106 may be a thermal CVD, PECVD or spray on/spin on deposited layer of a-C or doped a-C, such as amorphous carbon doped with boron, nitrogen, sulfur, chlorine, fluorine or metals (Al, Zr, Ti, W). The hardmask layer 106 may be silicon-containing spin on mask, carbon-containing spin on mask, photoresist, etc.

The plasma etched structure may have a layer of polymer (not shown) deposited on a sidewall of the aperture during plasma etching. The polymer passivation layer may however be easily removed or cleaned or polished by dry or wet etch chemistries well known in the art, including the disclosed fluorine containing etching gases.

FIG. 1b is a cross-sectional side view of exemplary horizontally isotropic etched recesses formed in the HAR aperture shown in FIG. 1a. The disclosed fluorine containing etching gases may selectively break Si—N bond in SiN layers 204b over Si—O bond in SiO layers 204a forming a selective sidewall SiN etch on the stack of SiO/SiN layers 204 in the HAR aperture or via 208. The difference between FIG. 1a and FIG. 1b is in FIG. 1b at least a portion of SiN exposed on an alternative SiO/SiN sidewall is horizontally isotropic etched by the disclosed fluorine containing etching gases forming recesses 210. Typically, the recesses 210 is performed by wet etching using mixtures with phosphoric acid. Replacing wet etch process with non-plasma dry thermal etch processes is known to greatly improve economics of semiconductor device fabrication process since wet etching requires moving substrates to different wet etching equipment. With the disclosed methods, all etching including selective sidewall SiN etch may be performed in one piece of etch equipment, which may effectively reduce the cost of the semiconductor fabrication.

One of ordinary skill in the art will recognize that that the stack of layers in the substrates 100 and 200, the aperture and geometry of layers in FIG. 1a and FIG. 1b are provided for exemplary purposes only.

EXAMPLES

The following non-limiting examples are provided to further illustrate embodiments of the invention. However, the examples are not intended to be all inclusive and are not intended to limit the scope of the inventions described herein.

The disclosed methods are applied to both planar (or blanket) and patterned wafers. The planar wafers are composed of planar SiN or $SiO_2$ layers deposited on a Si substrate that defines an initial or first film thickness. The patterned wafers are composed of a stack of alternating layers of $SiN/SiO_2$ (ONON) deposited on a Si substrate. A patterned mask layer is deposited on the stack of alternating layers of $SiN/SiO_2$ (ONON) layers. Prior to applying the disclosed methods, the ONON patterned wafer was pre-formed using a plasma CCP (capacitively coupled plasma) etcher and hydrofluorocarbon etching gas or the like to form the initial apertures or pre-formed apertures therein. The pre-formed apertures have a first defined sidewall width for both SiN and $SiO_2$ layers. With the disclosed methods, the SiN and $SiO_2$ planar wafers and the $SiN/SiO_2$ stacked patterned wafers with the pre-formed apertures are etched with the disclosed fluorine containing etching gas. An etching composition may be selected from the group consisting of FNO, $F_3NO$, $FNO_2$, $F_2$, NO, and combinations thereof. Etched planar SiN and $SiO_2$ layers are removed from the top layer to produce a second defined film thickness. The difference between the first and second thickness r defines the etching amount. The ratio of etching amount for SiN to $SiO_2$ defines the selectivity for blanket wafers. For the patterned wafers, the lateral or horizontal etch around the pre-formed apertures produces a second defined sidewall width for each SiN and $SiO_2$ layers. The differences between the first and second defined sidewall widths determine the lateral or horizontal etching amount. The ratio of etching amount for SiN to $SiO_2$ defines the selectivity of SiN to $SiO_2$ for the patterned wafers.

Figure 4:
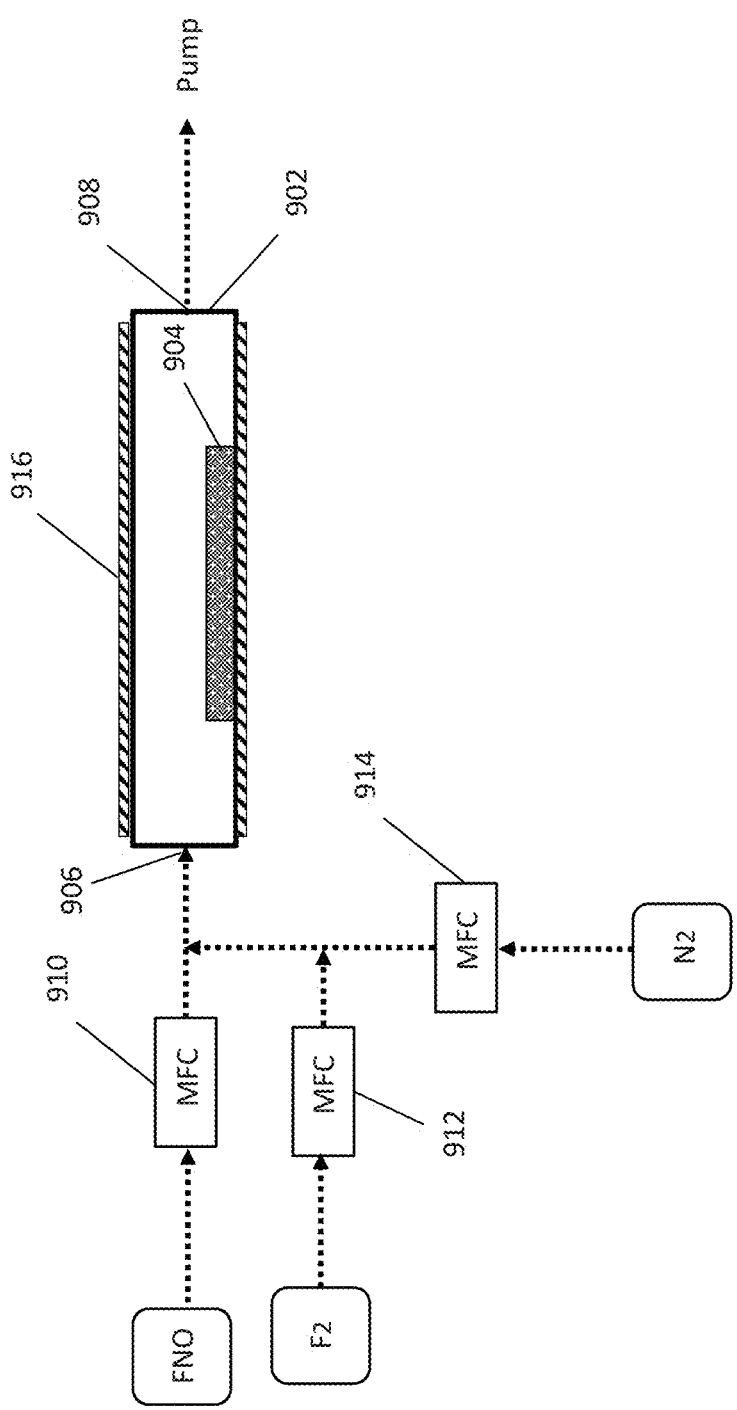
FIG. 4 is a cross-sectional side view of exemplary tube reactor system applied in isotropic etching tests.

Etching tests were carried out with a homemade tool as shown in FIG. 4, which will be described below. The planar wafers were purchased from ADVANTEC Co., LTD. The ONON patterned wafers were purchased from SKW Associates, Inc. Two planar wafer samples displaced simultaneously in a reaction chamber, in which one sample was a 300 nm or 2000 nm of SiN planar wafer on Si substrate, and the other one was a 200 nm of $SiO_2$ planar wafer on Si substrate.

Figure 3A:
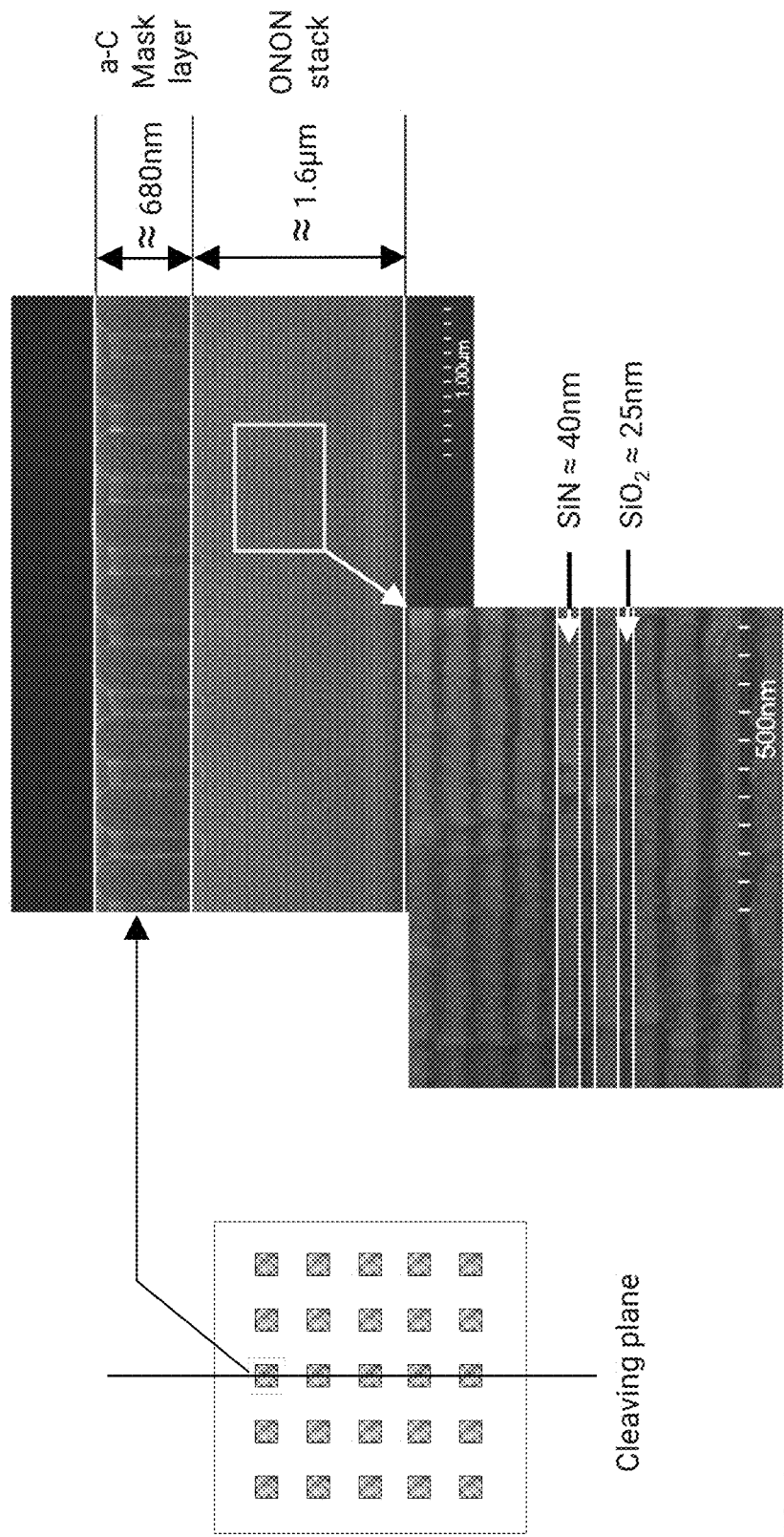
FIG. 3a is a SEM image of a patterned wafer for anisotropic plasma etching.
Figure 3B:
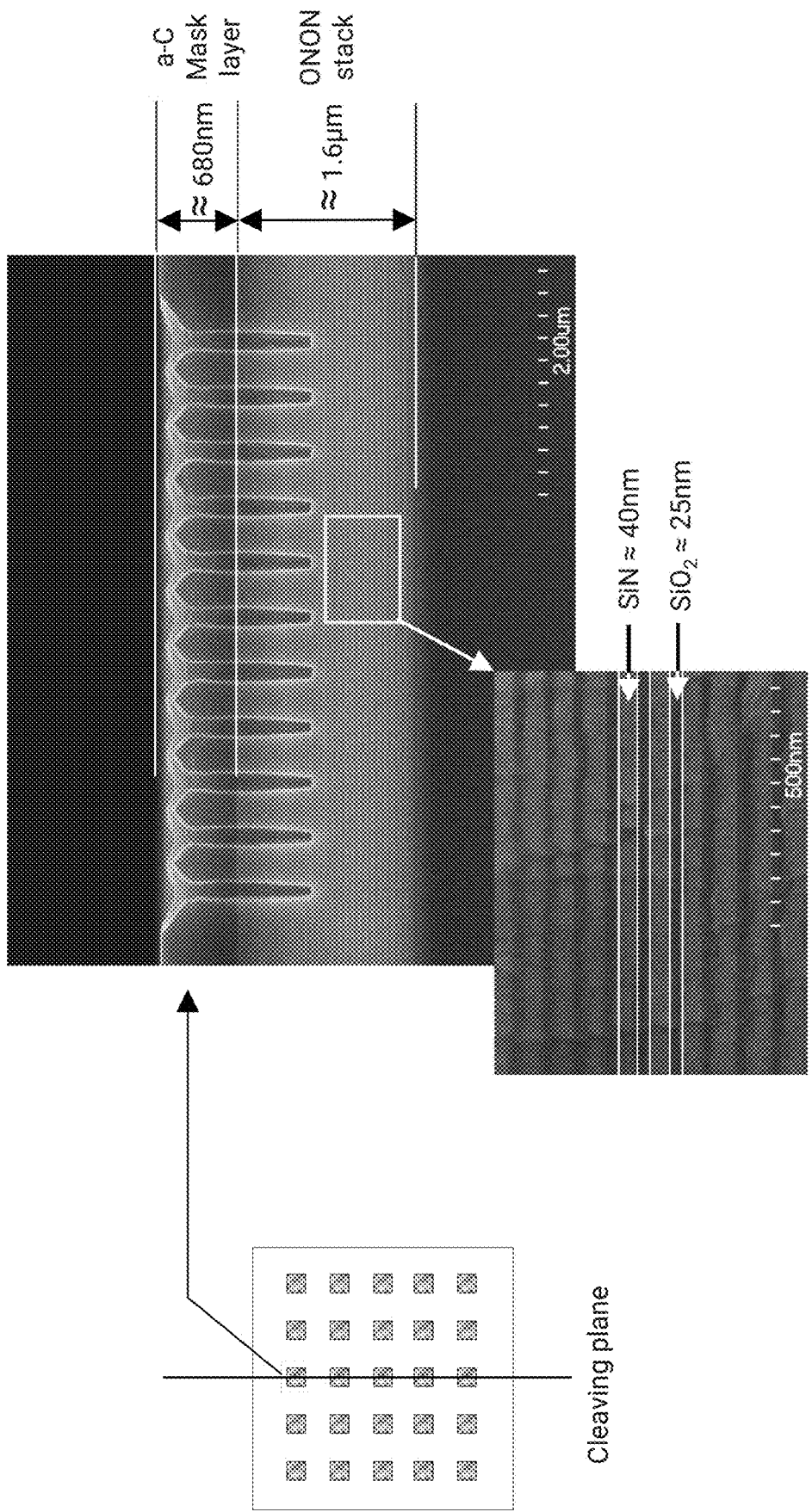
FIG. 3b is a SEM image of a patterned wafer after anisotropic plasma etching forming plasma etched apertures for isotropic etching.
Figure 3C:
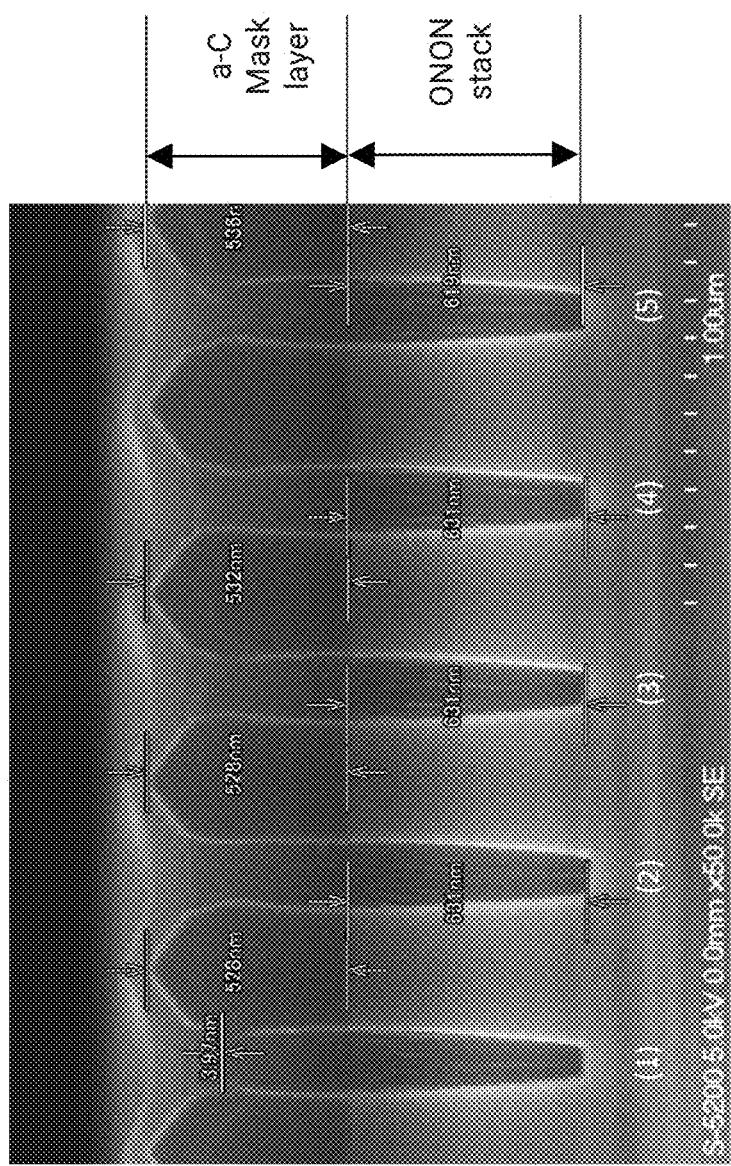
FIG. 3c is a SEM image of the plasma etched apertures shown in FIG. 3b with marked depths.
Figure 3D:
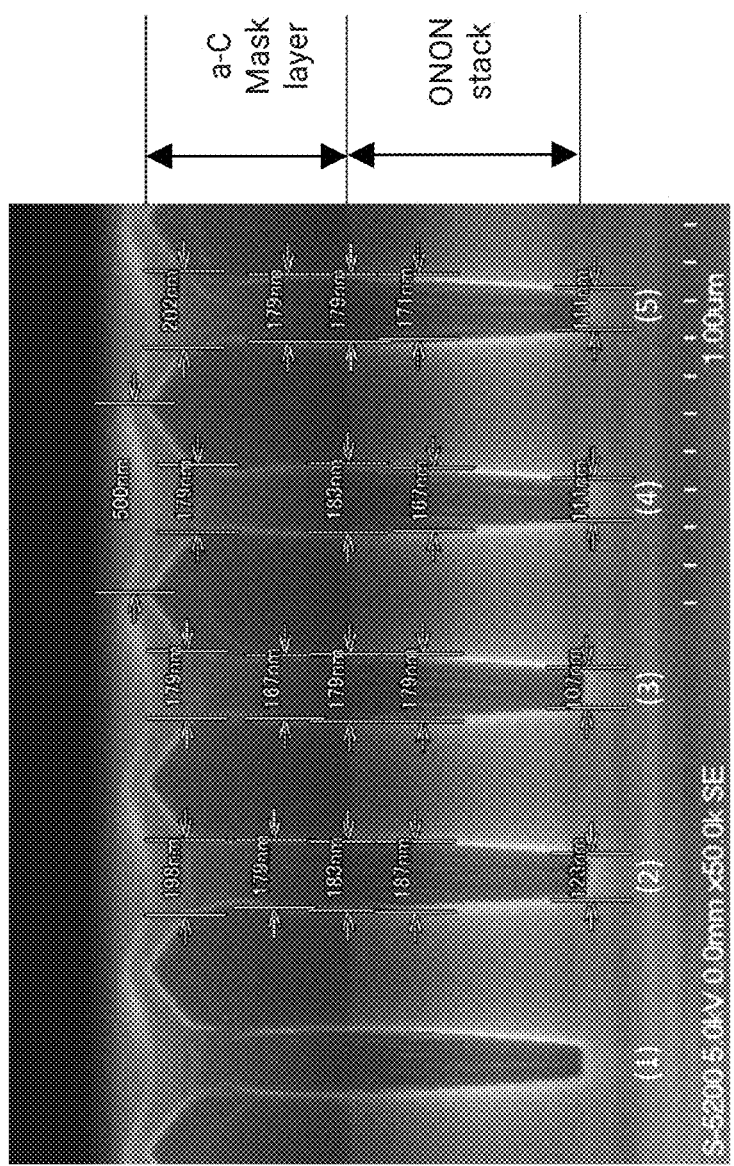
FIG. 3d is a SEM image of the plasma etched apertures shown in FIG. 3b with marked widths.

An exemplary ONON patterned wafer is shown in FIG. 3a. As shown, a patterned a-C hardmask layer is about 680 nm thick with a pattern of square holes evenly distributed in the a-C hardmask layer. The ONON layer is about 1.6 um thick and has 60 alternating layers of 40 nm SiN layer and 25 nm $SiO_2$ layer. An exemplary ONON patterned wafer with pre-formed apertures, as shown in FIG. 3b to FIG. 3d, feature an etched HAR aperture structure. As shown in FIG. 3b, the pre-formed apertures are formed in the ONON layer. The pre-formed apertures are HAR apertures that may be obtained by using a hydrofluorocarbon etching gas with plasma dry etching process to etch the ONON layer. For example, the hydrofluorocarbon etching gas may be selected from the group consisting of 1,1,1,3,3,3-hexafluoropropane ($C_3H_2F_6$), 1,1,2,2,3,3-hexafluoropropane (iso-$C_3H_2F_6$), 1,1,1,2,3,3,3-heptafluoropropane ($C_3HF_7$), and 1,1,1,2,2,3,3-heptafluoropropane (iso-$C_3HF_7$). The HAR apertures may also be obtained by using traditional etch gases to plasma etch the ONON layer. The traditional etch gases include, but are not limited to, c$C_4F_8$, $C_4F_8$, $C_4F_6$, $C_5F_8$, $CF_4$, $CH_3F$, $CHF_3$, $CH_2F_2$, COS, $CS_2$, $CF_3I$, $C_2F_3I$, $C_2F_5I$, CFN, $SO_2$ and combinations thereof. FIG. 3c and FIG. 3d show widths and depths of apertures (e.g., apertures (1) to (5)) formed in the ONON layer. The apertures (1) to (5) each have a nearly straight vertical structure with smooth sidewalls. The aperture depth is approximately 630 nm after plasma etching. The hole width is approximately 176 nm after plasma etching.

Etching tests were performed at a pressure ranging from approximately 1 Torr to approximately 400 Torr and a temperature ranging from room temperature to approximately 1000° C. One of the ordinary skill in the art will recognize that a temperature below room temperature, such as, 0° C. to room temperature, or even a cryogenic temperature, for example, −196° C. to room temperature, may be applied. The sample size was 2 cm×2 cm. The gas flow rate at the gas inlet (or gas flow rate for all gases) of the reaction chamber was 50 to 1000 sccm. FNO concentration in the etching compositions may range from 0.1% to 20% by volume. One of ordinary skilled in the art will recognize during etching processes, temperature, pressure, flow rate, FNO concentration, and etch time vary.

Additionally, a SEM may be used to study the horizontal isotropic etching results on the SiN and $SiO_2$ layers.

The etching tests were done in a homemade tube reactor. FIG. 4 is an exemplary non-plasma thermal dry etching system with a homemade tube reactor used in the etching tests. The system includes a tube reactor 902 having a gas inlet 906 and a gas outlet 908 at each end. A sample 904 is placed in the tube reactor 902. Etching gases, such as, FNO, but not limited to, and additional gases, such as, $F_2$ and $N_2$, but not limited to, each pass through mass flow controllers (MFC) 910, 912 and 914, respectively, are mixed and then sent to the gas inlet 906. The gas outlet 908 connected to a pump pumps the etching by-products, the unreacted etching gases and the additional gases out of the tube reactor 902. The numerical 916 represents thermal coils for heating or a cooling system, such as, a liquid nitrogen cooling system, integrated with the tube reactor 902 in order to adjust its temperature. During the etching tests, the temperature and the pressure of the tube reactor 902 were maintained at preferred values or ranges.

Example 1: Etching with FNO on Planar Wafers

Table 2 is a summary of selectivity of SiN and $SiO_2$ planar wafers etched with FNO mixed with $N_2$ under various conditions. The temperature ranged from 250° C. to 400° C. The pressure ranged from 100 Torr to 400 Torr. The total flow rate of the etching gases (FNO, $N_2$) ranged from 333 to 1000 sccm. The concentration of FNO ranged from 1% to 15% by volume. No $F_2$ was added. The etching time ranged from 10 to 60 mins.

Figure 5A:
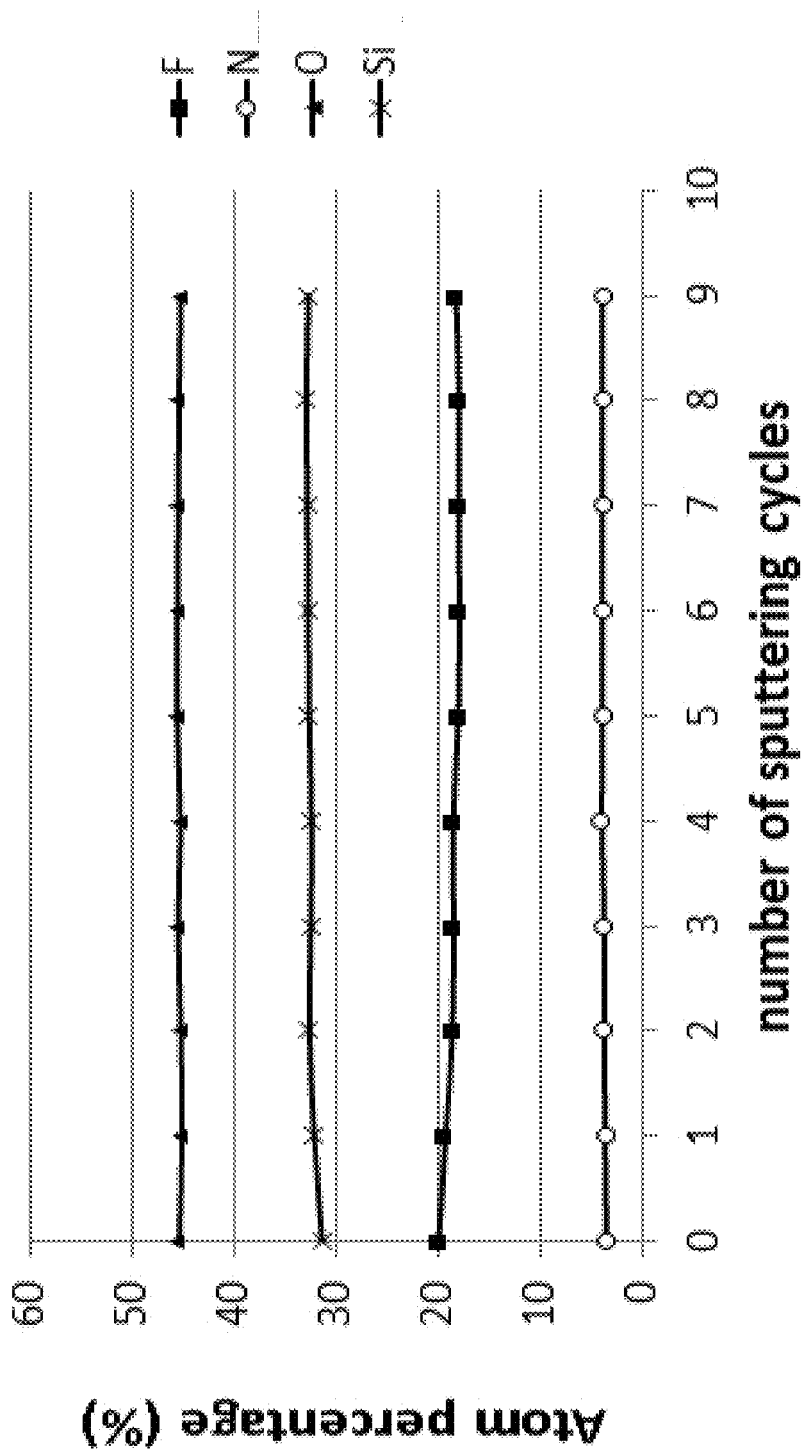
FIG. 5a is a XPS graph of the atomic percentage of elements of the planar SiN film after etching with FNO versus number of sputtering cycles.
Figure 5B:
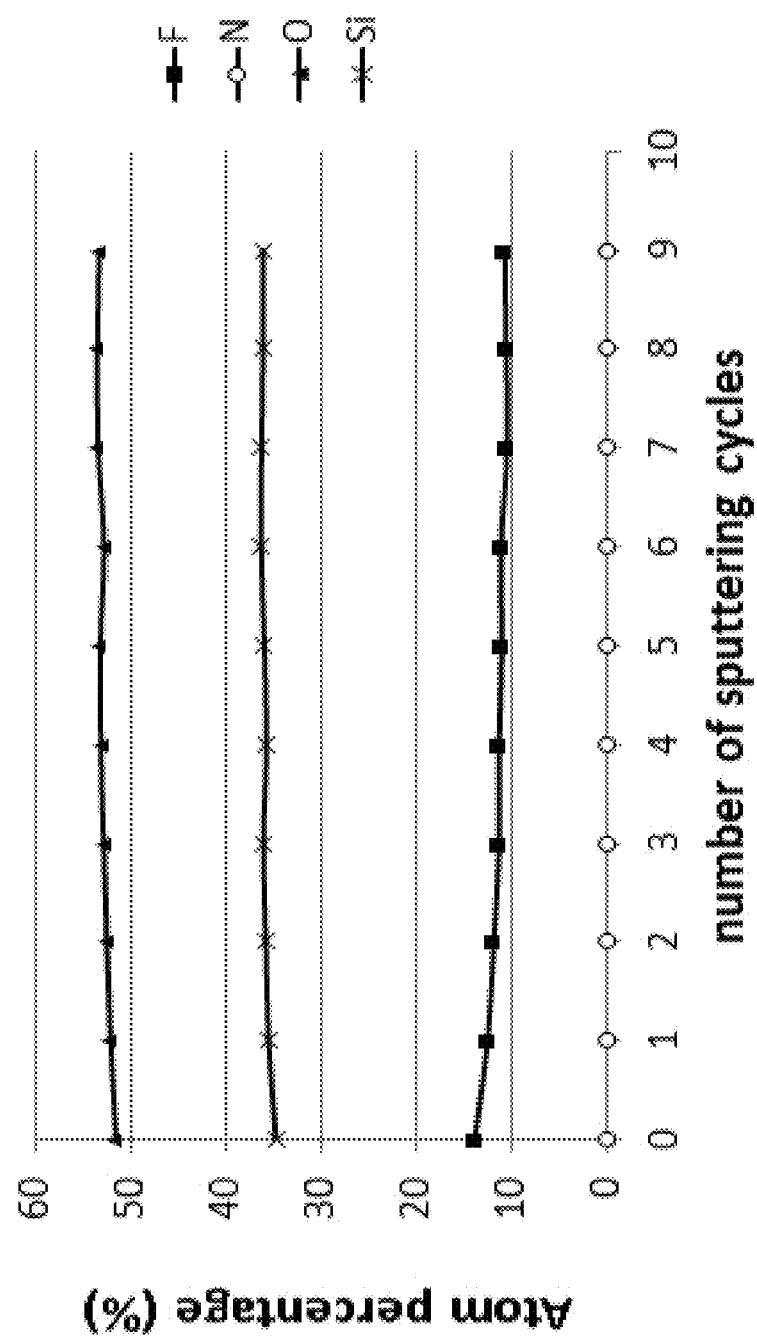
FIG. 5b is a XPS graph of the atomic percentage of elements of the planar $SiO_2$ film after etching with FNO versus number of sputtering cycles.

After etching with FNO mixing with $N_2$ under the above conditions, a selectivity of SiN versus $SiO_2$ is 177.9, as shown in Table 2. As shown in FIG. 5a and FIG. 5b, there was no nitrogen on the etched surface of $SiO_2$, but approximately 3% nitrogen remained on the etched surface of SiN for 9 sputtering cycles. Oxygen was the dominant atom on

TABLE 2

Selectivity of SiN versus $SiO_2$ of planar wafers etched with FNO under various conditions

| | Parameters | | | | | Etch rate | | |
|---|---|---|---|---|---|---|---|---|
| ex-$F_2$ % | FNO conc. (%) | total flow rate (sccm) | T (° C.) | P (Torr) | etch time (min) | SiN (nm/min) | $SiO_2$ min) | Selectivity SiN/$SiO_2$ |
| 0 | 1 | 1000 | 250 | 100 | 30 | 1.83* | 0.14 | 13.4 |
| | 3 | 1000 | 250 | 100 | 30 | 2.96 | 0.11 | 27.5 |
| | | 500 | 400 | 400 | 30 | 11.46 | 0.17 | 66.1 |
| | 5 | 1000 | 250 | 100 | 10 | 9.19* | 0.30 | 30.6 |
| | | | | | 20 | 12.65* | 0.17 | 74.4 |
| | | | | | 30 | 3.86 | 0.09 | 42.9 |
| | | | | | 60 | 4.78 | 0.07 | 68.3 |
| | 10 | 500 | 250 | 100 | 30 | 9.55 | 0.15 | 63.7 |
| | | | | 250 | 30 | 34.64 | 0.30 | 116.2 |
| | | | | 400 | 30 | 53.91 | 0.30 | 177.9 |
| | | | 400 | 100 | 30 | 21.92 | 0.14 | 156.6 |
| | | | | 250 | 30 | 35.91 | 0.17 | 215.4 |
| | 15 | 333 | 250 | 250 | 30 | 43.77 | 0.29 | 150.8 |

*300 nm thick SiN samples.

As shown, the etch rate of SiN and the selectivity of SiN versus $SiO_2$ increased with the increases of T, P, and the concentration of FNO (% by volume). The selectivity of SiN versus $SiO_2$ was over 150 at 400° C., 100 or 250 Torr with 10% FNO by volume. At 250° C. and 250 Torr with 15% FNO by volume, the selectivity of SiN versus $SiO_2$ was also larger than 150. The same to 250° C. and 400 Torr with 10% FNO by volume. No $F_2$ was added.

Example 2: Etching Surface Analyses

FIG. 5a and FIG. 5b are XPS graphs of the atomic percentage of elements after etching planar SiN and $SiO_2$, respectively, with FNO mixed with $N_2$ versus number of sputtering cycles. The etching conditions are as follows: temperature was 250° C.; pressure was 400 Torr; the total flow rate of FNO, Ar and $O_2$ was 500 sccm; FNO concentration is 10% by volume; the etching time was 30 mins.

both surfaces of SiN and $SiO_2$. Si was approximately 35% on both surfaces of SiN and $SiO_2$. Fluorine was in between approximately 10% to approximately 20% on both surfaces of SiN and $SiO_2$.

Example 3: Cycle Etch

Table 3 is a list of cycle etch results. The cycle etch tests were done by refreshing surface passivation in order to understand the etching performance. The etching conditions are as follows: temperature was 250° C.; pressure was 100 Torr and 400 Torr, respectively; FNO concentration was 10% by volume in $N_2$; and the etching times were 30 mins, 10×3 cycles and 5×6 cycles, respectively. As shown, the cycle etch enhances the etching for $SiO_2$, and therefore decreases the selectivity of SiN/$SiO_2$.

TABLE 3

Cycle Etch Results

| | Parameters | | | | | Etch rate | | |
|---|---|---|---|---|---|---|---|---|
| ex-$F_2$ % | FNO conc. (%) | total flow rate (sccm) | T (° C.) | P (Torr) | etch time (min) | SiN (nm/min) | $SiO_2$ (nm/min) | Selectivity SiN/$SiO_2$ |
| 0 | 10 | 500 | 250 | 100 | 30 | 9.55 | 0.15 | 63.7 |
| | | | | | 10 × 3 cycles | 14.53 | 1.01 | 14.4 |
| | | | | | 5 × 6 cycles | 11.31 | 0.69 | 16.5 |
| | | | | 400 | 30 | 53.91 | 0.30 | 177.9 |
| | | | | | 10 × 3 cycles | 40.57 | 0.50 | 80.4 |
| | | | | | 5 × 6 cycles | 43.97 | 0.61 | 72.3 |

Example 4: Effect of $F_2$ Addition to FNO

Figure 6:
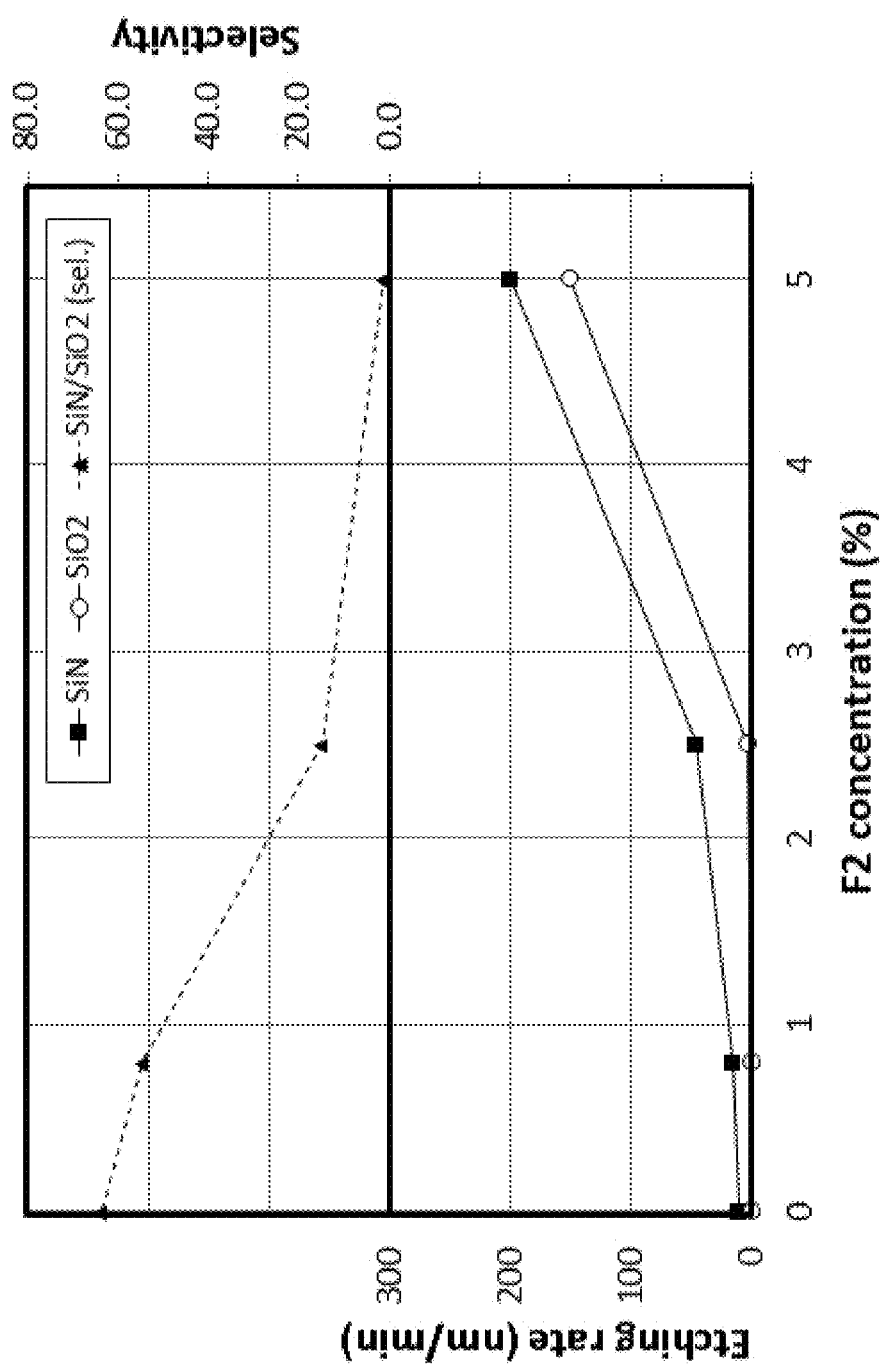
FIG. 6 is a graph of the $F_2$/FNO etching rate of planar wafers versus $F_2$ concentration.

FIG. 6 is a graph of the $F_2$/FNO etching rate of planar wafers versus $F_2$ concentration. The etching conditions are as follows: temperature was 250° C.; pressure was 100 Torr; FNO concentration was 10% by volume in $N_2$; and the etching times were 30 mins and a reduced time to prevent etch out of SiN, respectively. Extra $F_2$, such as, 0.8%, 2.5% and 5% $F_2$ by volume, was compared with no $F_2$ addition. The etching results is also listed in Table 4 below.

TABLE 4

Etching Results with $F_2$ addition to FNO

| | Parameters | | | | | Etch rate | | |
|---|---|---|---|---|---|---|---|---|
| ex-$F_2$ % | FNO conc. (%) | total flow rate (sccm) | T (° C.) | P (Torr) | etch time (min) | SiN (nm/min) | $SiO_2$ (nm/min) | Selectivity SiN/$SiO_2$ |
| 0 | 10 | 500 | 250 | 100 | 30 | 9.55 | 0.15 | 63.7 |
| 0.8 | | | | | | 14.18 | 0.26 | 54.5 |
| 2.5 | | | | | | 45.70 | 3.11 | 14.7 |
| 5 | | | | | 10* | 200.12 | 150.18 | 1.3 |

As shown, after etching with $F_2$ addition to FNO under the above conditions, the etch rates for both SiN and $SiO_2$ increased. Whereas, the selectivity of SiN/$SiO_2$ decreased dramatically with increasing $F_2$ concentration due to significant increase of $SiO_2$ etching rate.

Example 5: Effect of NO Addition to FNO

Table 5 is etching results on planar wafers etched with NO addition to FNO. The etching conditions are as follows: temperature was 250° C.; pressure was 100 Torr; FNO concentration was 10% by volume in $N_2$; and the etching times was 30 mins. Extra NO, i.e., 0, 5% NO and 10% NO by volume, was added respectively.

TABLE 5

Etching Results with NO Addition to FNO

| | Parameters | | | | | Etch rate | | |
|---|---|---|---|---|---|---|---|---|
| ex-NO % | FNO conc. (%) | total flow rate (sccm) | T (° C.) | P (Torr) | etch time (min) | SiN (nm/min) | $SiO_2$ (nm/min) | Selectivity SiN/$SiO_2$ |
| 0 | 10 | 500 | 250 | 100 | 30 | 9.55 | 0.15 | 63.7 |
| 5 | | | | | | 11.45 | 0.09 | 127.2 |
| 10 | | | | | | 11.18 | 0.08 | 139.8 |

As shown, the etch rate of SiN increased with additional NO, but saturated at 5% ex-NO by volume. The etch rate of $SiO_2$ decreased with additional NO, but also nearly saturated at 5% ex-NO by volume. The selectivity of SiN/$SiO_2$ further increased with NO addition. The etched amount of $SiO_2$ is around 2.5 nm after 30 mins etching. NO may help SiN etching by forming $N_2$ or $N_2O$.

Example 6: Etching with FNO on Patterned Wafer

Figure 7:
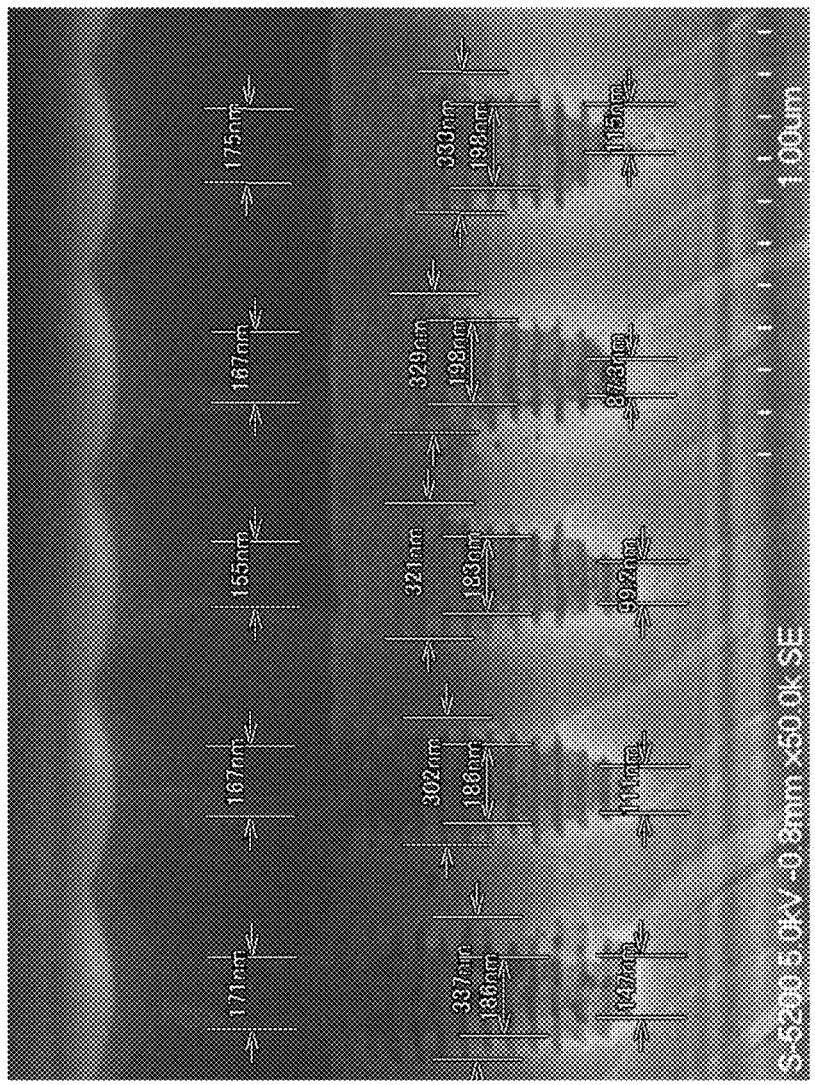
FIG. 7 is a SEM image of the patterned wafer after isotropic etching with FNO.

FIG. 7 is a SEM image of the patterned wafer after isotropic etching with FNO. The etching conditions are as follows: temperature was 250° C.; pressure was 100 Torr; FNO concentration was 10% by volume in $N_2$; and the etching time was 30 mins. After etching with FNO under the above condition, a lateral SiN etch rate of 4.95±0.55 nm/min and a lateral $SiO_2$ etch rate of 0.47±0.38 nm/min were obtained. Thus, the lateral selectivity was 10.5±8.6. Referring to Table 2, the planar selectivity under the same conditions was 63.7.

Example 7: Etching with FNO on Patterned Wafer with Increased Pressure

Figure 8A:
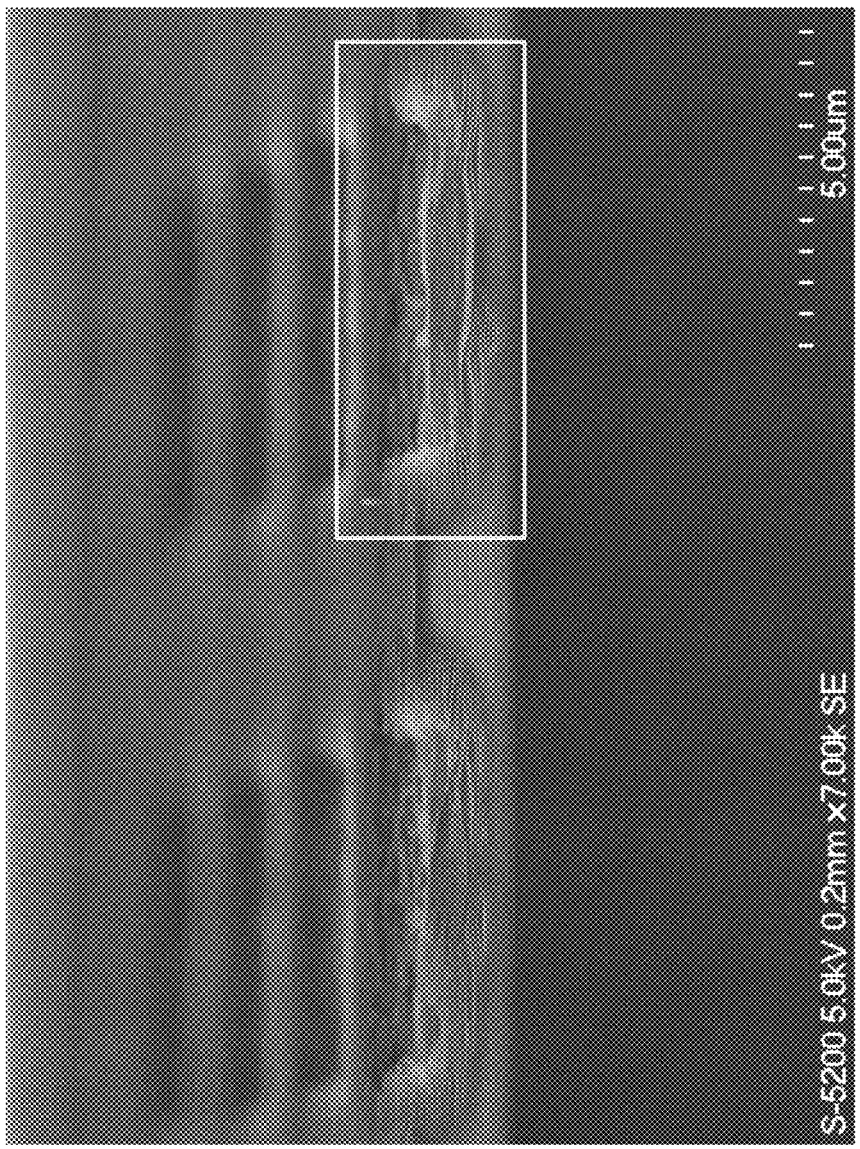
FIG. 8a is a SEM image of the patterned wafer after isotropic etched with FNO with increased pressure.
Figure 8B:
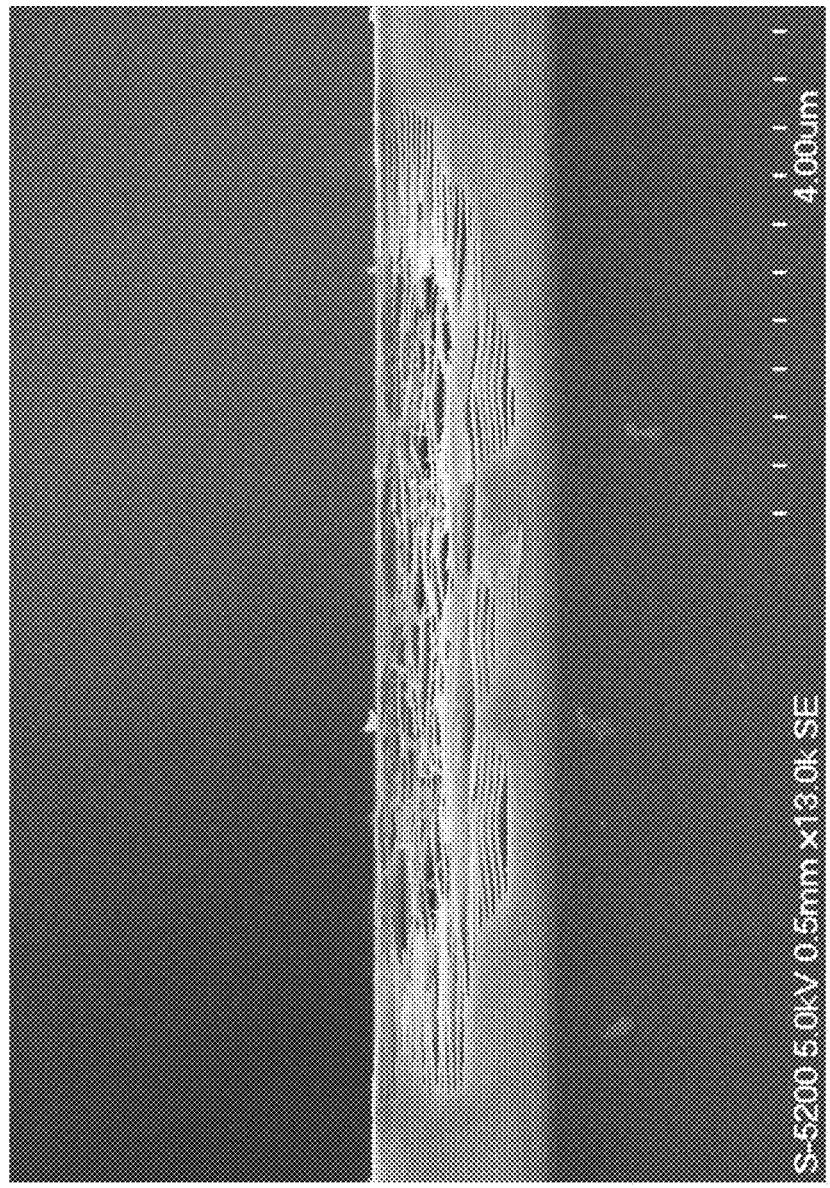

FIG. 8a and FIG. 8b are SEM images of the patterned wafer after isotropic etching with FNO with increased pressure. The etching conditions are as follows: temperature was 250° C.; pressure was 400 Torr; FNO concentration was 10% by volume in $N_2$; and the etching time was 30 mins. Referring to Table 3, the planar selectivity under the same conditions was 177.9. However, under these conditions, etching on the patterned wafer caused the ONON stacked layer to collapse and the a-C mask layer was etched out. In addition, the underlayers were also etched.

Figure 9A:
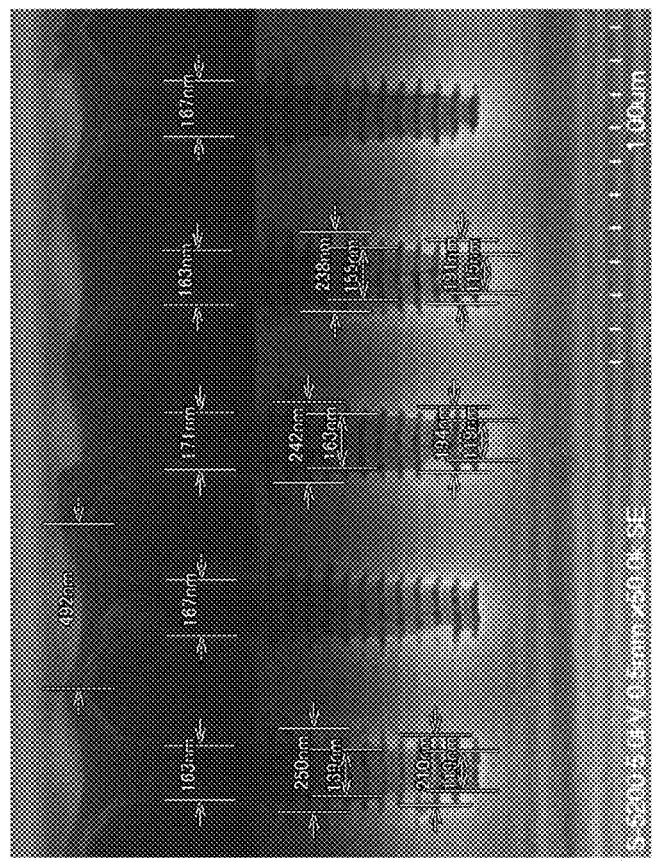
FIG. 9a is a SEM image of the patterned wafer after isotropic etched with FNO with etching time of 3 mins.
Figure 9B:
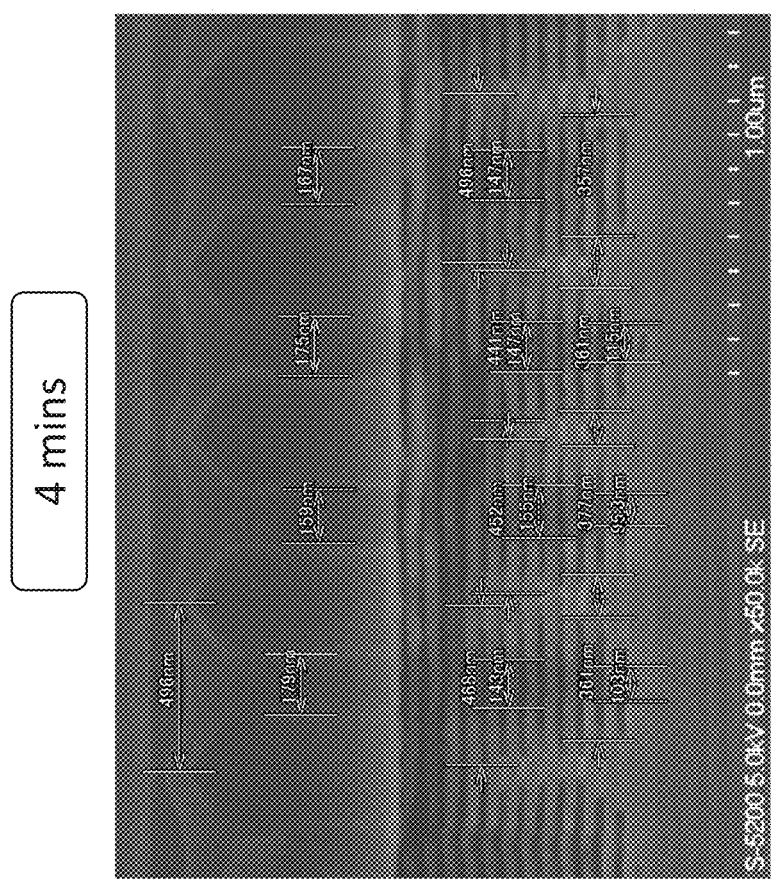
FIG. 9b is a SEM image of the patterned wafer after isotropic etched with FNO with etching time of 4 mins.
Figure 9C:
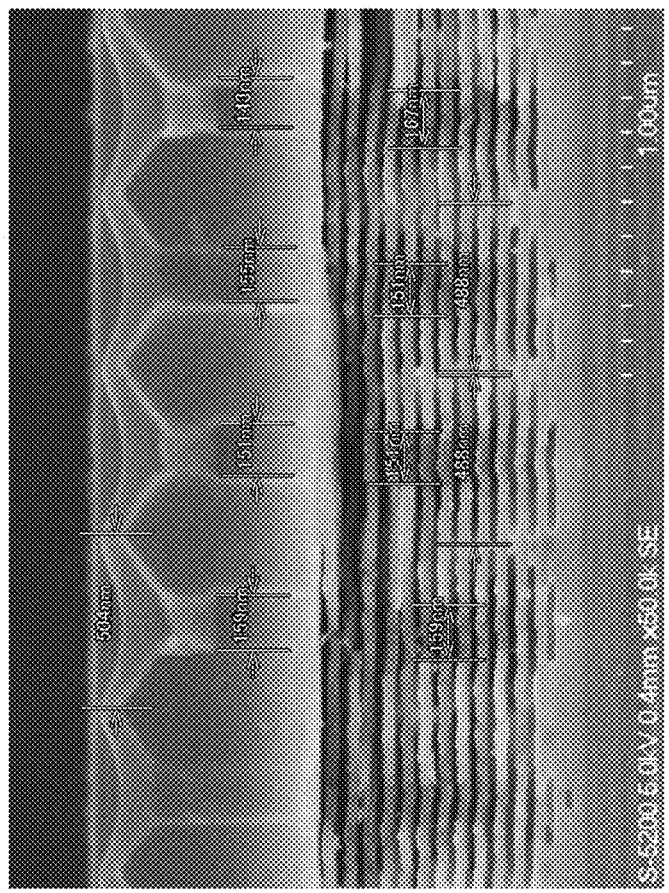
FIG. 9c is a SEM image of the patterned wafer after isotropic etched with FNO with etching time of 5 mins.

Example 8: Etching with FNO on Patterned Wafer with Various Reduced Etching Times FIG. 9a to FIG. 9c are SEM images of the patterned wafer after isotropic etching with FNO with various reduced etching times. The etching conditions are as follows: temperature was 250° C.; pressure was 400 Torr; FNO concentration was 10% by volume in $N_2$; and the etching time varied from 3 mins to 5 mins. When the etching time was 3 mins (FIG. 9a), lateral SiN etch rate was approximately 22.4 nm/min and the etched amount was approximately 67.3 nm. When the etching time was 4 mins (FIG. 9b), lateral SiN etch rate was approximately 72.1 nm/min and the etched amount was approximately 288.3 nm. When the etching time was 5 mins (FIG. 9c), lateral SiN etch rate was approximately 62.4 nm/min and the etched amount was approximately 312 nm. The etch rate and the etched amount may vary if the cutting plane varies. With 4 mins of the etch time, lateral SiN etch rate of approximately 72.1 nm/min was obtained by ONON patterned wafer, where the etch rate with the ONON patterned wafer was even higher than those with the planar wafers as shown in Table 2 under the same conditions.

Example 9: Passivation Process

A FNO passivation line for etching experiments and analyses was prepared as shown in FIG. 10. 5% by volume FNO in $N_2$ was connected to a gas cabinet for setting up. A vacuum line of <$10^{-1}$ mbar was first generated in the gas cabinet. 5% by volume FNO in NO was then input into the gas cabinet where the pressure of the gas cabinet was maintained at 0.01 MPa for 1 hour. In the following step the gases in the gas cabinet was removed and 5% FNO by volume in NO was delivered into the gas cabinet again to maintain a pressure at 0.15 MPa for 1 hour therein. Then the gases in the gas cabinet was removed and 5% FNO by volume in NO was delivered into the gas cabinet again. In the following steps, 5% FNO by volume in NO was delivered into the gas cabinet and then removed from the gas cabinet alternatively. Each time the pressure of the gas cabinet with 5% FNO by volume in NO delivered in the gas cabinet was increased and maintained for 8 hours. Four pressures, i.e., 0.40 MPa, 1.00 MPa, 2.00 MPa and 3.16 MPa, were maintained for 8 hours, respectively. The gases were removed between the two consecutive pressures and then the gas cabinet was refilled with fresh 5% FNO by volume in NO. When the pressure reached a high pressure range, such as, 1.00 MPa, 2.00 MPa and 3.16 MPa, a secondary pressure was adjusted by a gas regulator and maintained at 0.5 MPa. After 8 hours at 3.16 MPa, the gas cabinet was vacuumed and purged. All element in the gas cabinet were tested and analyzed with metal samplings and ICP-MS and all element were under detector limit. No internal leakage was found.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for isotropic etching at least a portion of a silicon-containing layer on a sidewall of a high-aspect-ratio (HAR) aperture formed on a substrate in a reaction chamber, the HAR aperture formed by plasma etching a stack of alternating layers of a first silicon-containing layer and a second silicon-containing layer, the second silicon-containing layer is different from the first silicon-containing layer, the method comprising the steps of:
   a) introducing a fluorine containing etching gas selected from the group consisting of nitrosyl fluoride (FNO), trifluoroamine oxide ($F_3NO$), nitryl fluoride ($FNO_2$) and combinations thereof into the reaction chamber; and
   b) removing at least a portion of the second silicon-containing layers by selectively etching the second silicon-containing layers versus the first silicon-containing layers with the fluorine containing etching gas to produce recesses between the first silicon-containing layers on the sidewall of the HAR aperture under a pressure ranging from approximately 1 to 400 Torr.

2. The method of claim 1, wherein the fluorine containing etching gas is FNO.

3. The method of claim 1, further comprising the steps of:
   c) purging the reaction chamber with an inert gas; and
   d) repeating a) to c).

4. The method of claim 1, wherein the first silicon-containing layer is $SiO_2$ and the second silicon-containing layer is poly-silicon.

5. The method of claim 1, wherein the etching step is performed under a temperature ranging from approximately −196° C. to room temperature.

6. The method of claim 1, wherein the etching step is performed under a temperature ranging from approximately room temperature to 400° C.

7. The method of claim 1, wherein the etching step is performed under a temperature ranging from approximately 400° C. to 1000° C.

8. The method of claim 1, further comprising the steps of:
   c) purging the reaction chamber with an inert gas;
   d) introducing an activation gas into the reaction chamber;
   e) purging the reaction chamber with the inert gas; and
   f) repeating a) to e).

9. The method of claim 8, wherein the activation gas is selected from the group consisting of Ar, Kr, Xe, Ne, He and $H_2$.

10. The method of claim 1, wherein the first silicon-containing layer is $SiO_2$ and the second silicon-containing layer is SiN.

11. The method of claim 10, wherein a ratio of etch rates for SiN versus $SiO_2$ ranges from 10 to 3000.

12. The method of claim 1, further comprising the step of introducing an additional gas with the fluorine containing etching gas.

13. The method of claim 12, wherein the additional gas is selected from the group consisting of $F_2$, NO, $O_2$, COS, $CO_2$, CO, $NO_2$, $N_2O$, $SO_2$, $O_3$, $Cl_2$, HF, $H_2$ and HBr.

14. The method of claim 13, wherein a concentration of the fluorine containing etching gas ranges from 0.1% to 20% by volume.

15. The method of claim 1, further comprising the steps of:
   c) purging the reaction chamber with an inert gas;
   d) introducing a mixture of etching gases into the reaction chamber;
   e) preserving the surface of the first silicon-containing layer from etching;
   f) purging the reaction chamber with the inert gas; and
   g) repeating a) to f).

16. The method of claim 15, wherein the mixture of etching gases is FNO, a mixture of FNO and NO, or a mixture of excess $F_2$ and NO.

17. The method of claim 15, wherein the inert gas is selected from the group consisting of $N_2$, Ar, Kr, He, Xe and Ne.

18. A method for isotropic etching at least a portion of a silicon-containing layer on a sidewall of a high-aspect-ratio (HAR) aperture formed on a substrate in a reaction chamber, the HAR aperture formed by plasma etching a stack of alternating layers of a first silicon-containing layer and a second silicon-containing layer, the second silicon-containing layer is different from the first silicon-containing layer, the method comprising the steps of:

introducing nitrosyl fluoride (FNO) gas into the reaction chamber;

introducing NO and an inert gas into the reaction chamber; and removing at least a portion of the second silicon-containing layers by selectively etching the second silicon-containing layers versus the first silicon-containing layers with FNO gas to produce recesses between the first silicon-containing layers on the sidewall of the HAR aperture.

19. The method of claim 18, further consisting of the step of introducing the inert gas and excess $F_2$ into the reaction chamber.

20. The method of claim 19, wherein the inert gas is selected from the group consisting of $N_2$, Ar, Kr, He, Xe and Ne.

* * * * *